United States Patent
Im

(10) Patent No.: US 9,355,738 B2
(45) Date of Patent: May 31, 2016

(54) NONVOLATILE MEMORY SYSTEM AND OPERATING METHOD OF MEMORY CONTROLLER

(71) Applicant: Jung Been Im, Anyang-si (KR)

(72) Inventor: Jung Been Im, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/728,345

(22) Filed: Jun. 2, 2015

(65) Prior Publication Data

US 2015/0357043 A1    Dec. 10, 2015

(30) Foreign Application Priority Data

Jun. 9, 2014    (KR) ........................ 10-2014-0069367

(51) Int. Cl.
| | | |
|---|---|---|
| *G11C 11/00* | (2006.01) | |
| *G11C 16/04* | (2006.01) | |
| *G11C 16/34* | (2006.01) | |
| *G11C 16/10* | (2006.01) | |
| *G11C 16/26* | (2006.01) | |

(52) U.S. Cl.
CPC .............. *G11C 16/349* (2013.01); *G11C 16/10* (2013.01); *G11C 16/26* (2013.01)

(58) Field of Classification Search
CPC .. G11C 16/26; G11C 11/403; G11C 16/0483; G11C 11/5642; G11C 11/405; G11C 11/5628; G11C 16/0433; G11C 16/24; G11C 11/404; G11C 16/08; G11C 16/0466; G11C 2211/5641; G11C 11/40; G11C 16/10; G11C 16/32; G11C 16/3459; G11C 16/349
See application file for complete search history.

(56) References Cited

U.S. PATENT DOCUMENTS

| | | | |
|---|---|---|---|
| 7,679,133 B2 | 3/2010 | Son et al. | |
| 8,369,155 B2 | 2/2013 | Park | |
| 8,374,029 B2 | 2/2013 | Liska et al. | |
| 8,422,307 B2 | 4/2013 | Yoo et al. | |
| 8,462,551 B2 | 6/2013 | Kim | |
| 8,488,398 B2 | 7/2013 | Sutardja | |
| 8,553,466 B2 | 10/2013 | Han et al. | |
| 8,559,235 B2 | 10/2013 | Yoon et al. | |
| 8,576,624 B2 | 11/2013 | Dutta et al. | |
| 8,611,157 B2 | 12/2013 | Dutta | |
| 8,654,587 B2 | 2/2014 | Yoon et al. | |
| 2011/0007563 A1 | 1/2011 | Yoo et al. | |
| 2011/0122706 A1 | 5/2011 | Park | |

(Continued)

FOREIGN PATENT DOCUMENTS

KR    2015-0107399 A    9/2015

*Primary Examiner* — Hien Nguyen
(74) *Attorney, Agent, or Firm* — Harness, Dickey & Pierce, P.L.C.

(57) ABSTRACT

An operating method of a memory controller configured to control a nonvolatile memory device including a plurality of memory cells is provided. The operating method includes: programming evaluation data into desired memory cells among the plurality of memory cells; performing initial verify shift (IVS) charge loss evaluation on the desired memory cells after a time elapses from a time point when the evaluation data is programmed, the IVScharge loss evaluation including an operation of detecting threshold voltage variation of the desired memory cells over a period based on the time elapsed from the time point when the evaluation data is programmed; and storing a result of the IVScharge loss evaluation; and adjusting levels of a plurality of read voltages used in the nonvolatile memory device based on the stored result of the charge loss evaluation.

20 Claims, 25 Drawing Sheets

(56) References Cited

U.S. PATENT DOCUMENTS

| | | |
|---|---|---|
| 2011/0233648 A1 | 9/2011 | Seol et al. |
| 2012/0087193 A1 | 4/2012 | Kim |
| 2012/0176846 A1 | 7/2012 | Sutardja |
| 2012/0236648 A1 | 9/2012 | Liska et al. |
| 2012/0236656 A1 | 9/2012 | Cometti |
| 2012/0239976 A1 | 9/2012 | Cometti et al. |
| 2013/0007543 A1 | 1/2013 | Goss et al. |
| 2013/0060994 A1 | 3/2013 | Higgins et al. |
| 2013/0132652 A1 | 5/2013 | Wood et al. |
| 2013/0148425 A1 | 6/2013 | Dutta et al. |
| 2013/0163342 A1 | 6/2013 | Dutta |
| 2013/0318422 A1 | 11/2013 | Weathers et al. |
| 2013/0322174 A1 | 12/2013 | Li et al. |
| 2013/0343125 A1* | 12/2013 | Gillingham ........ G11C 11/5628 365/185.03 |
| 2014/0153330 A1* | 6/2014 | Yoon ................. G11C 11/5642 365/185.03 |
| 2015/0262697 A1 | 9/2015 | Kim |

* cited by examiner

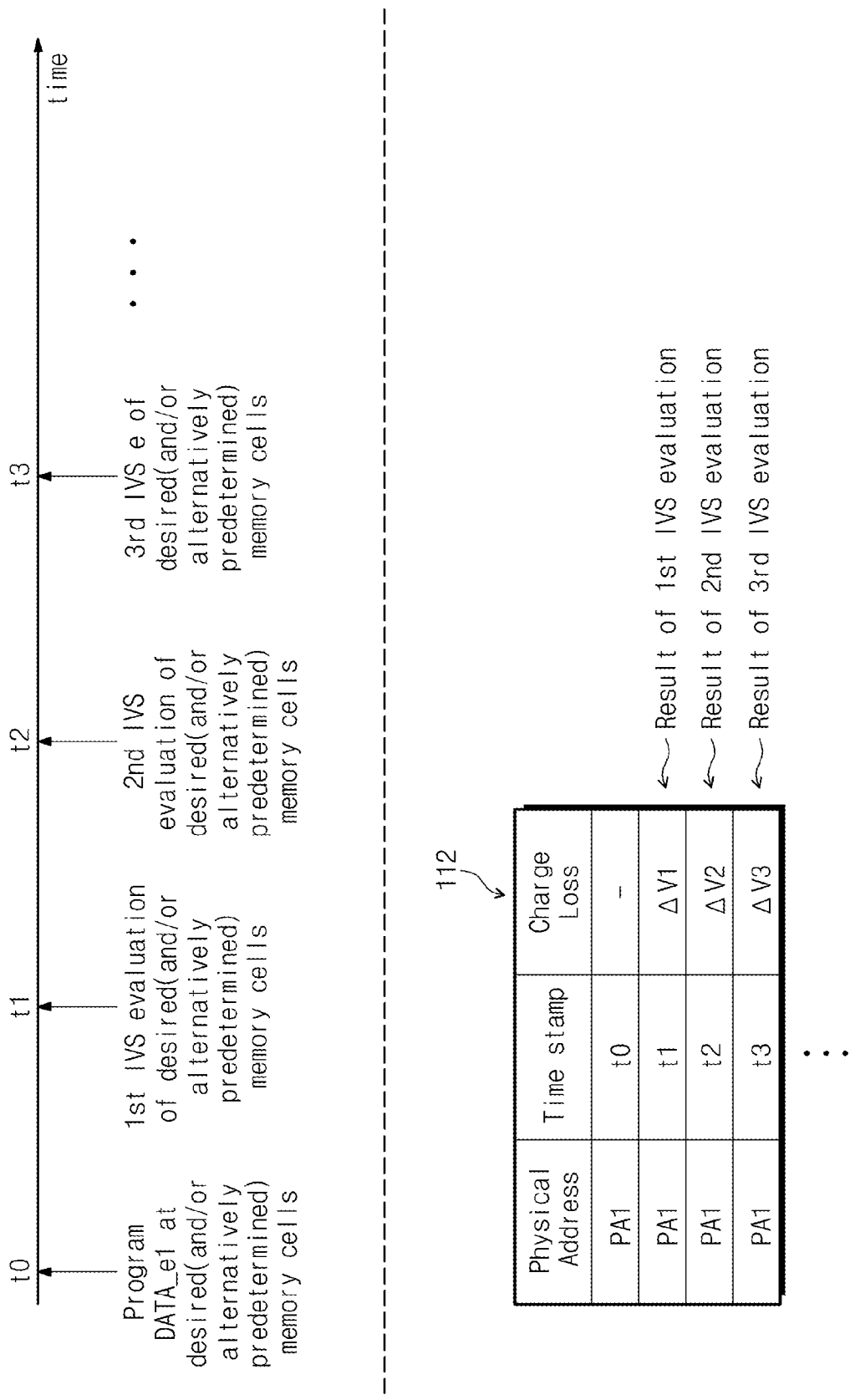

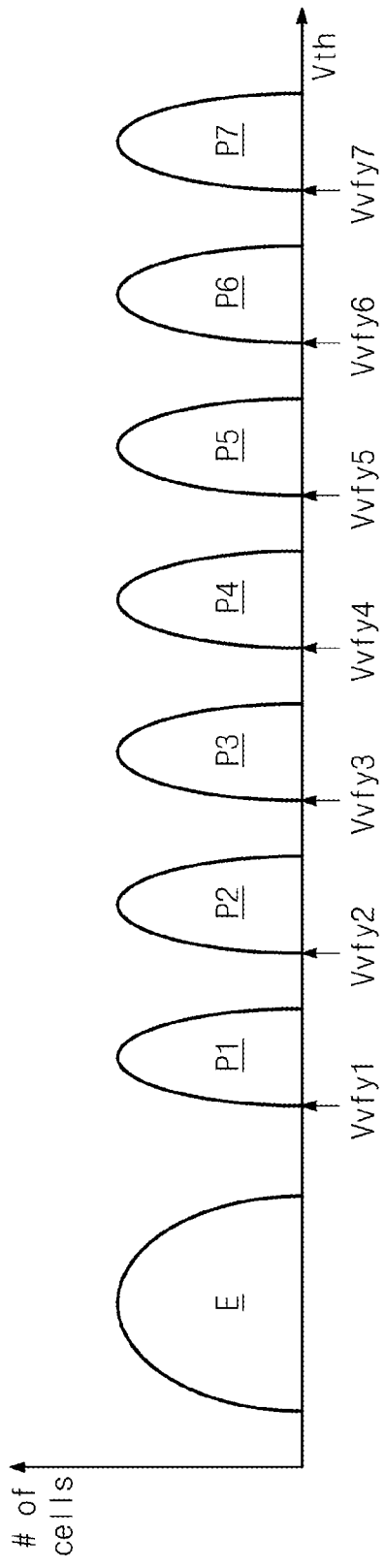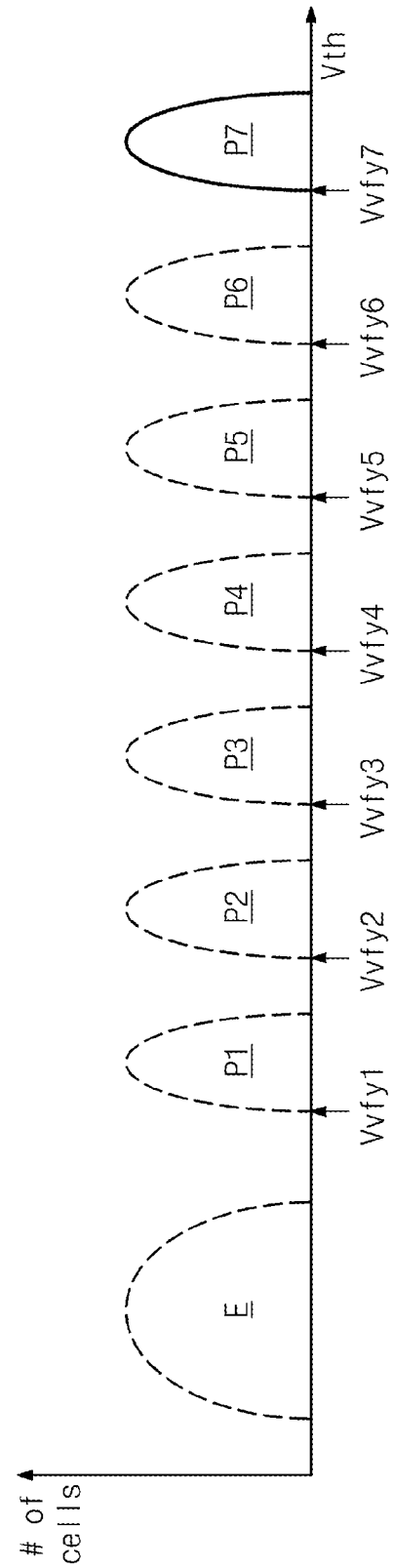

| Elapsed Time | ET1 | ET2 | ET3 | ... | ETn | |
|---|---|---|---|---|---|---|
| Charge Loss | $\Delta V11$ | $\Delta V21$ | $\Delta V31$ | ... | $\Delta Vn1$ | ← sLUT1 |
| | $\Delta V12$ | $\Delta V22$ | $\Delta V32$ | ... | $\Delta Vn2$ | ← sLUT2 |
| | $\Delta V13$ | $\Delta V23$ | $\Delta V33$ | ... | $\Delta Vn3$ | ← sLUT3 |
| | ⋮ | ⋮ | ⋮ | | ⋮ | |
| | $\Delta V1m$ | $\Delta V2m$ | $\Delta V3m$ | ... | $\Delta Vnm$ | ← sLUTm |

FIG. 19B sLUT1

| | ET1 | ET2 | ET3 | ... | ETn |
|---|---|---|---|---|---|
| Vrd1 | $V_{SL_1}11$ | $V_{SL_1}21$ | $V_{SL_1}31$ | ... | $V_{SL_1}n1$ |
| Vrd2 | $V_{SL_1}12$ | $V_{SL_1}22$ | $V_{SL_1}32$ | ... | $V_{SL_1}n2$ |
| Vrd3 | $V_{SL_1}13$ | $V_{SL_1}23$ | $V_{SL_1}33$ | ... | $V_{SL_1}n3$ |
| Vrd4 | $V_{SL_1}14$ | $V_{SL_1}24$ | $V_{SL_1}34$ | ... | $V_{SL_1}n4$ |
| Vrd5 | $V_{SL_1}15$ | $V_{SL_1}25$ | $V_{SL_1}35$ | ... | $V_{SL_1}n5$ |
| Vrd6 | $V_{SL_1}16$ | $V_{SL_1}26$ | $V_{SL_1}36$ | ... | $V_{SL_1}n6$ |
| Vrd7 | $V_{SL_1}17$ | $V_{SL_1}27$ | $V_{SL_1}37$ | ... | $V_{SL_1}n7$ |

NONVOLATILE MEMORY SYSTEM AND OPERATING METHOD OF MEMORY CONTROLLER

CROSS-REFERENCE TO RELATED APPLICATIONS

This US non-provisional patent application claims priority under 35 USC §119 to Korean Patent Application No. 10-2014-0069367, filed on Jun. 9, 2014, the entirety of which is hereby incorporated by reference.

BACKGROUND

The present disclosure relates to semiconductor memories and, more particularly, to a nonvolatile memory system including a nonvolatile memory device and a memory controller and an operating method of the memory controller.

Semiconductor memory device are memory devices implemented using a semiconductor such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Nonvolatile memory devices may include a static RAM (SRAM), a dynamic RAM (DRAM), and a synchronous DRAM (SDRAM). Nonvolatile memory devices are memory retain their stored data even when their power supplies are interrupted. Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), and a ferroelectric RAM (FRAM).

Flash memories have been used in a variety of applications due to low noise, low power consumption, and high-speed operation. For example, a mobile system such as a smartphone and a tablet PC uses a high-capacity flash memory as a storage medium.

A flash memory includes semiconductor elements such as a floating gate memory cell and a charge trap flash (CTF) memory cell. In particular, the CTF memory cell traps charges to a charge storage layer such that a threshold voltage of a memory cell is changed to store data. However, a threshold voltage of the CTF memory cell is changed as charges stored in the charge storage layer migrate to a channel layer with the lapse of time. This physical characteristic is called initial verify shift (IVS). Due to the IVS, data stored in CTF memory cells is lost.

In order to overcome the above disadvantage, a memory system implemented with a CTF memory cell separately manages program time. However, although the memory system separately manages the program time, threshold voltage change caused by IVS varies depending on characteristics (e.g., erase count, external temperature, etc.) of the respective memory cells. Accordingly, there is a need for a separate management method.

SUMMARY

The present disclosure relates to nonvolatile memory systems and/or operating methods of memory controllers.

According to example embodiments of inventive concepts, a memory controller configured to control a nonvolatile memory device including a plurality of memory cells. The operating method of the memory controller comprises programming evaluation data into desired memory cells among the plurality of memory cells, performing charge loss evaluation on the desired memory cells after a time elapses from a time point when the evaluation data is programmed, the charge loss evaluation including an operation of detecting threshold voltage variation of the desired memory cells over a period based on the time elapsed from the time point when the evaluation data is programmed, storing a result of the charge loss evaluation, and adjusting levels of a plurality of read voltages used in the nonvolatile memory device based on the stored result of the charge loss evaluation.

In example embodiments, the charge loss evaluation is periodically performed.

According to example embodiments of inventive concepts, a nonvolatile memory system comprises a nonvolatile memory device including a plurality of memory cells, and a memory controller configured to program evaluation data into desired memory cells among the plurality of memory cells, perform charge loss evaluation on the desired memory cells in which the evaluation data is stored after a threshold time elapses from a time point when the evaluation data is programmed, and store a result of the charge loss evaluation in an charge loss evaluation table, the charge loss evaluation including an operation of detecting threshold voltage variation of the desired memory cells over a period based on the time elapsed from the time point when the evaluation data is programmed.

According to example embodiments of inventive concepts, a memory system including a controller configured to control a nonvolatile memory device, the nonvolatile memory device including a plurality of memory cells. The operating method of the nonvolatile memory system comprises performing charge loss evaluation on first memory cells among the plurality of memory cells, the first memory cells being programmed with evaluation data, after a time elapses from a time point when the first memory cells were programmed with evaluation data, storing a result of the performing the charge loss evaluation on the first memory cells, and controlling a read operation of the first memory cells based on the result of the performing the charge loss evaluation on the first memory cells.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. In the drawings:

FIG. 7 illustrates an operating method of the memory controller 110 shown in FIG. 6.

FIGS. 8 and 9 are distribution diagrams illustrating the evaluation data DATA_e shown in FIG. 1.

FIG. 19A is a diagram illustrating the lookup table in FIG. 17.

FIG. 19B is a diagram illustrating one of the sub-lookup tables in FIG. 19A.

DETAILED DESCRIPTION

Figure 1:
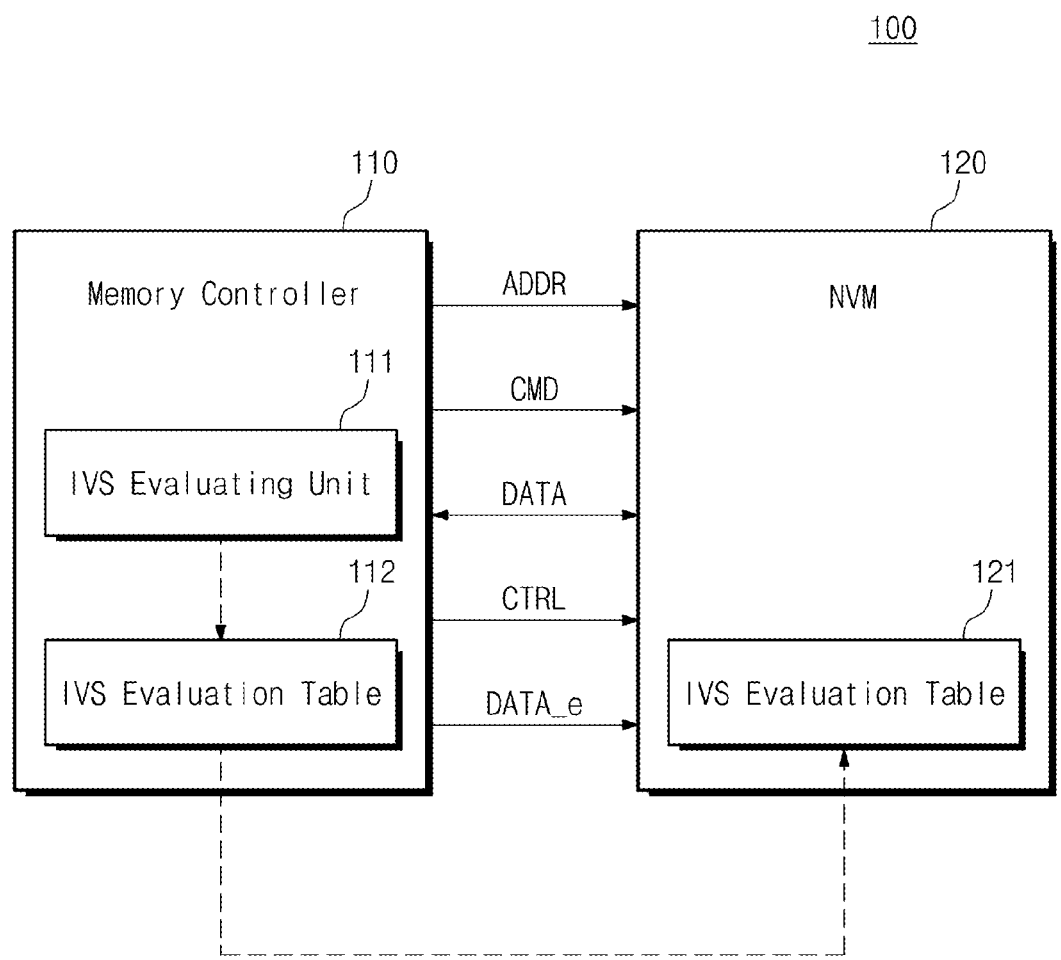
FIG. 1 is a block diagram of a nonvolatile memory system according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A memory controller according to example embodiments of inventive concepts periodically programs evaluation data for initial verify shift (IVS) evaluation (or, charge loss evaluation) into a nonvolatile memory device. The IVS evaluation indicates an operation to detect the threshold voltage variation of memory cells that changes as time elapses. The memory controller may periodically detect the threshold voltage variation of the memory cells into which the evaluation data is programmed and may store the detected threshold voltage variation as a result of the IVS evaluation. The memory controller may perform operations such as level adjustment of a plurality of read voltages and power-off time detection, based on the stored the result of the IVS evaluation.

FIG. 1 is a block diagram of a nonvolatile memory system according to example embodiments of inventive concepts. Referring to FIG. 1, the nonvolatile memory system 100 includes a memory controller 110 and a nonvolatile memory device 120.

The memory controller 110 may write data DATA into the nonvolatile memory device 120 or may read data DATA stored in the nonvolatile memory device 120. For example, the memory controller 110 may transmit an address ADDR, a command CMD, a control signal CTRL, and data DATA to the nonvolatile memory device 120 to write the data DATA into the nonvolatile memory device 120. Alternatively, the memory controller 110 may transmit an address ADDR, a command CMD, and a control signal CTRL to the nonvolatile memory device 120 to read the data DATA stored in the nonvolatile memory device 120.

The nonvolatile memory device 120 may perform operations such as write, read, or erase operations for data DATA in response to signals received from the memory controller 110. In example embodiments, the nonvolatile memory device 120 may include nonvolatile memory devices such as a NAND flash memory, a NOR flash memory, a phase change memory (PRAM), a resistive memory (ReRAM), and a magnetic resistance memory (MRAM). For brevity of description, an example will be described where the nonvolatile memory device 120 is provided based on a NAND flash memory. In example embodiments, the nonvolatile memory device 120 may be provided based on charge trap flash (CTF) memory cells.

In example embodiments, when the nonvolatile memory device 120 is provided based on the CTF memory cells, initial verify shift (IVS) occurs due to physical properties of the CTF memory cells. The IVS will be explained in further detail later with reference to FIG. 5.

The memory controller 110 includes an IVS evaluating unit 111 and an IVS evaluation table 112. The IVS evaluating unit 111 may periodically write evaluation data DATA_e into the nonvolatile memory device 120 to evaluate charge loss (or, threshold voltage variations) of memory cells caused by the IVS of the nonvolatile memory device 120. The IVS evaluating unit 111 may periodically perform IVS evaluation to detect charge loss (or, the threshold voltage variations) of the memory cells into which the evaluation data DATA_e is written among a plurality of memory cells included in the nonvolatile memory device 120. The IVS evaluating unit 111 may store a result of the IVS evaluation result in the IVS evaluation table 112.

The IVS evaluation table 112 may be periodically or non-periodically flushed to the nonvolatile memory device 120. The IVS evaluation table 121 stored in the nonvolatile memory device 120 may be stored in a meta area (not shown) of the nonvolatile memory device 120.

Hereinafter, for brevity of description, an example will be described where IVS evaluation indicates an operation to detect charge loss of memory cells into which the evaluation data DATA_e is written. In addition, an example will be described where the charge loss indicates the threshold voltage variation of memory cells. In exemplary embodiments, the IVS evaluation may refer to as 'charge loss evaluation'.

In example embodiments, the memory controller 110 may adjust levels of a plurality of read voltages used in the nonvolatile memory device 120 or detect power-off elapsed time, based on the IVS evaluation table 112.

As described above, the memory controller 110 may write the evaluation data DATA_e into the nonvolatile memory device 120 and periodically perform IVS evaluation to store the IVS evaluation result in the IVS evaluation table 112. Since the memory controller 110 may periodically perform the IVS evaluation and store the IVS evaluation result to check characteristics of the nonvolatile memory device 120, a nonvolatile memory system with improved reliability is provided.

Figure 2:
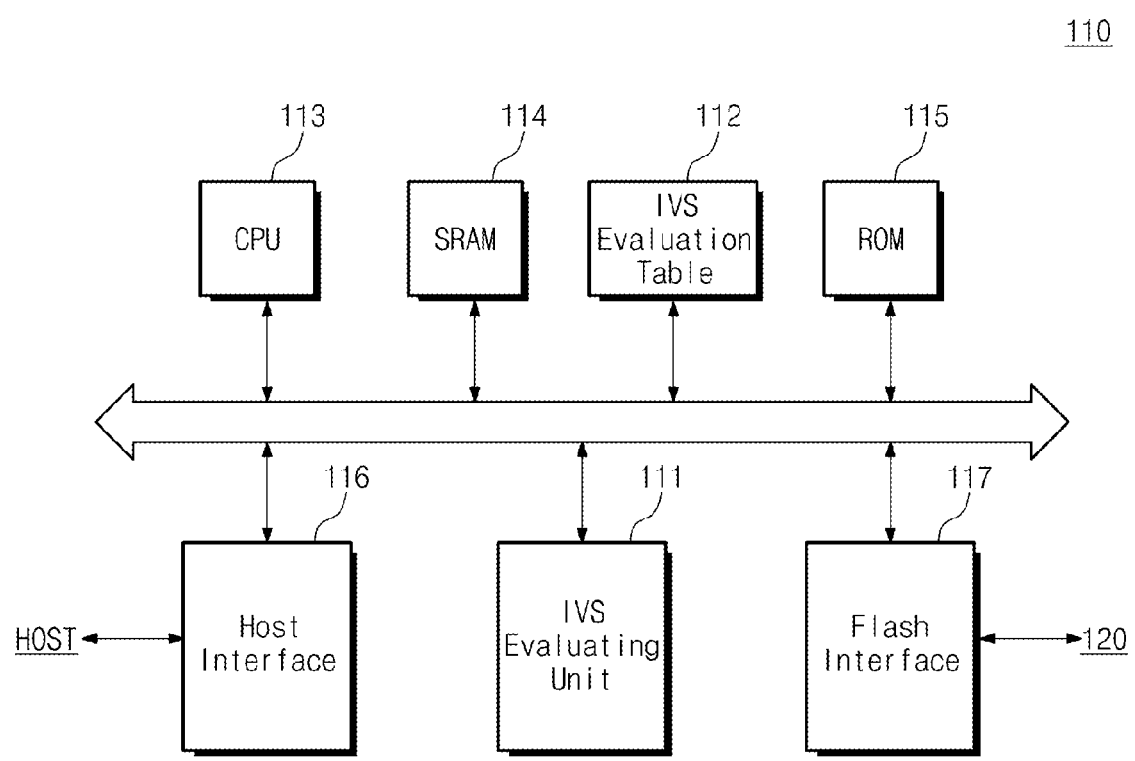
FIG. 2 is a block diagram of the memory controller shown in FIG. 1.

FIG. 2 is a block diagram of the memory controller shown in FIG. 1. Referring to FIGS. 1 and 2, the memory controller 110 includes an IVS evaluating unit 111, an IVS evaluation table 112, a central processing unit (CPU) 113, a static random access memory (SRAM) 114, a read only memory (ROM) 115, a host interface 116, and a flash interface 117. The IVS evaluating unit 111 and the IVS evaluation table 112 have been described with reference to FIG. 1 and will not be described in further detail.

The CPU 113 may control the overall operation of the memory controller 110. The SRAM 114 may be used as a cache memory, a buffer memory, a working memory or the like of the memory controller 110. The ROM 115 may store various types of data used to operate the memory controller 110 in the form of firmware. In example embodiments, the CPU 113 may read firmware stored in the ROM 115 and drive the read firmware. The CPU 113 may be hardware.

In example embodiments, the IVS evaluating unit 111 may be implemented with a software layer, stored in a portion of the ROM 115 or the nonvolatile memory device 120, and driven by the CPU 113. The IVS evaluation table 112 may be stored in the SRAM 114.

The memory controller 110 may communicate with a host through the host interface 116. In example embodiments, the host interface 116 may include various interfaces such as an Universal Serial Bus (USB), a multimedia card (MMC), a peripheral component interconnection (PCI), a PCI-express, an Advanced Technology Attachment (ATA), a Serial-ATA, a Parallel-ATA, a small computer small interface (SCSI), an enhanced small disk interface (ESDI), an Integrated Drive Electronics (IDE), a Mobile Industry Processor Interface (MIPI), a Nonvolatile Memory-express (NVM-e), an universal flash storage interface (UFS) and so on. The memory controller 110 may communicate with the nonvolatile memory device 120 through a flash interface 117. In example embodiments, the flash interface 117 may include a NAND interface.

Although not shown in the figures, the memory controller 110 may further include components such as an error correction code (ECC) engine to detect and correct an error of data stored in the nonvolatile memory device 120 and a randomizer to process data to be stored in the nonvolatile memory device 120.

Figure 3:
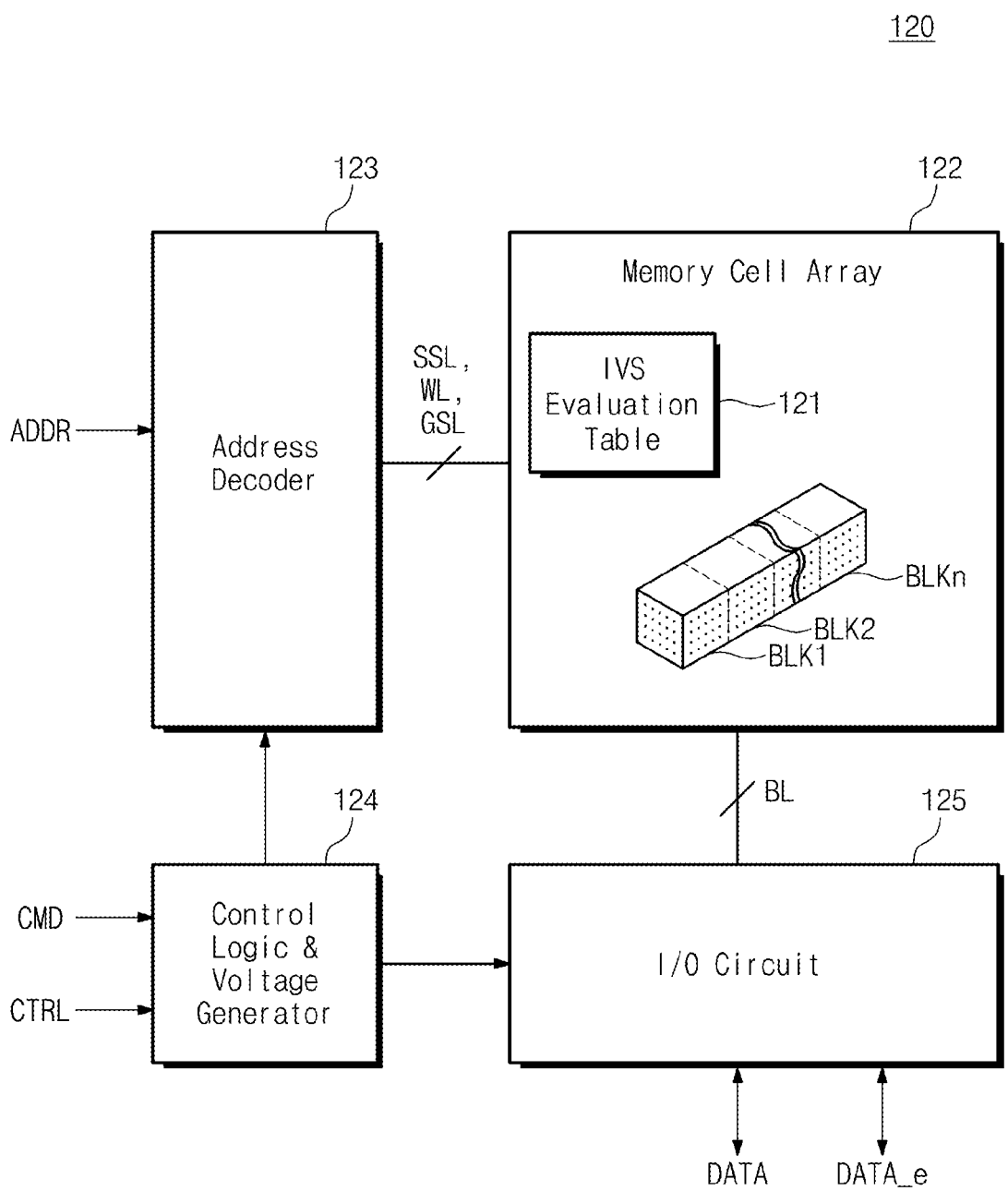
FIG. 3 is a block diagram of the nonvolatile memory device 120 shown in FIG. 1.

FIG. 3 is a block diagram of the nonvolatile memory device 120 shown in FIG. 1. Referring to FIGS. 1 and 3, the nonvolatile memory device 120 may include a memory cell array 122, an address decoder 123, a control logic and voltage generator 124, and an input/output (I/O) circuit 125.

The memory cell array 122 includes a plurality of memory blocks BLK1 to BLKn. Each of the memory blocks BLK1 to BLKn includes a plurality of cell strings. Each of the cell strings includes a plurality of memory cells. The memory cells are connected to a plurality of wordlines WL, respectively. Each of the memory cells may include a single-level cell (SLC) storing a single bit or a multi-level cell (MLC) storing at least two bits.

In example embodiments, each of the memory blocks BLK1 to BLKn may have a three-dimensional structure stacked in a direction perpendicular to a substrate (not shown). A structure of the memory block will be described in detail later with reference to FIG. 4.

In example embodiments, some of the memory blocks BLK1 to BLKn included in the memory cell array 122 may be used as a meta region and the IVS evaluation table 121 may be stored in the metal region. In example embodiments, some of the memory blocks BLK1 to BLKn included in the memory cell array 122 may store the IVS evaluation table 121.

The address decoder 123 is connected to the memory cell array 122 through a plurality of wordlines WL, string selection lines SSL, and ground selection lines GSL. The address decoder 123 may receive an address ADDR and decode the received address ADDR to drive the wordlines WL.

The control logic and voltage generator 124 may receive a command CMD and a control signal CTRL from the memory controller 110 and control the address decoder 123 and the I/O circuit 125 in response to the received signals. For example, the control logic and voltage generator 124 may control the address decoder ADDR and the I/O circuit 125 to write data DATA or the evaluation data DATA_e into the memory cell array 122 in response to the command CMD and the control signal CTRL. Alternatively, the control logic and voltage generator 124 may control the address decoder 123 and the I/O circuit 125 to output the data DATA stored in the memory cell array 122 in response to the command CMD and the control signal CTRL. Alternatively, the control logic and voltage generator 124 may control the address decoder 123 and the I/O circuit 125 to erase a portion of the memory cell array 122 in response to the command CMD and the control signal CTRL.

The control logic and voltage generator 124 may generate various voltages used by the nonvolatile memory device 120. For example, the control logic and voltage generator 124 may generate various voltages such as a plurality of selected read voltages, a plurality of unselected read voltages, a plurality of program voltages, a plurality of pass voltages, and a plurality of erase voltages, etc. and provide the generated voltages to the address decoder 123 and the memory cell array 122.

The I/O circuit 125 is connected to the memory cell array 122 through a plurality of bitlines BL. The I/O circuit 125 may control the bitlines BL to write the data DATA or the evaluation data DATA_e received from the memory controller 110 into the memory cell array 122. Alternatively, the I/O circuit 125 may control the bitlines BL to output the data DATA written into the memory cell array 122. In example embodiments, the I/O circuit 124 may be configured to perform a copyback operation.

In example embodiments, the I/O circuit 124 may include components such as a page buffer (or page register), a column select circuit, a data buffer, and a global buffer. In example embodiments, the I/O circuit 124 may include components such as a sense amplifier, a write driver, a column select circuit, and a data buffer.

In example embodiments, when the IVS evaluation is performed, the nonvolatile memory device 120 may determine program states of the memory cells, in which the evaluation data DATA_e is stored, n times according to the control of the memory controller 110. The memory controller 110 may perform the IVS evaluation based on the determined program states.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
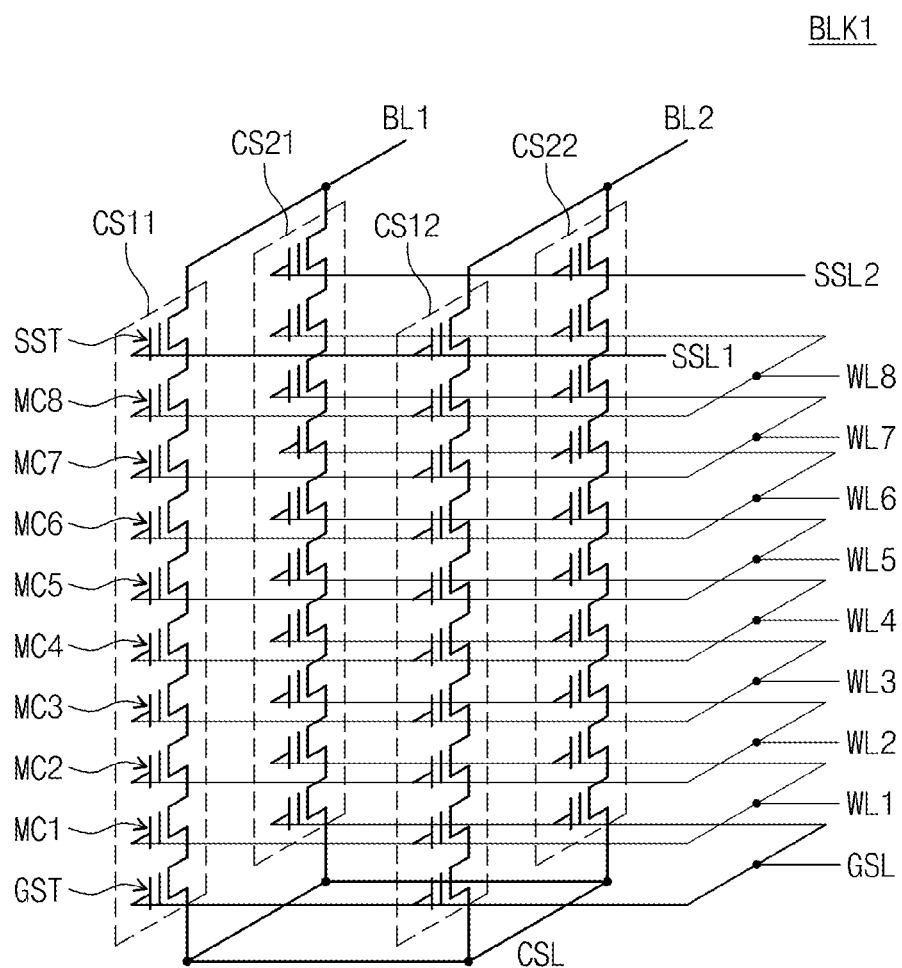
FIG. 4 is a circuit diagram of a first memory block BLK1 among the memory blocks BLK1 to BLKn shown in FIG. 3.

FIG. 4 is a circuit diagram of a first memory block BLK1 among the memory blocks BLK1 to BLKn shown in FIG. 3. Although the first memory block BLK1 will be described with reference to FIG. 4, example embodiments are not limited thereto and the other memory blocks BLK2 to BLKn may have the same structure as the first memory block BLK1.

Referring to FIGS. 3 and 4, the first memory block BLK1 includes a plurality of cell strings CS11, CS12, CS21, and CS22. The cell strings CS11, CS12, CS21, and CS22 may be arranged in a row direction and a column direction to form rows and columns.

Each of the cell strings CS11, CS12, CS21, and CS22 may include a plurality of cell transistors. The cell transistors include a string select transistor SST, a plurality of memory cells MC1 to MC8, and a ground select transistor GST. The string select transistor SST is connected to a string select line SSL. The string select line SSL is divided into first and second string select lines SSL1 and SSL2. The memory cells MC1 to MC8 are connected to wordlines WL1 to WL8, respectively. A wordline of the same height is commonly connected. The ground select transistor GST is connected to a ground select line GSL. Each cell string is coupled between a bitline BL and a common source line GSL. That is, the string select transistor SST is connected to the bitline BL and the ground select transistor GST is connected to the common source line CSL.

Cell strings arranged at the same column are connected to the same bitline. For example, the cell strings CS11 and CS21 are connected to a first bitline BL1. The cell strings CS12 and CS22 are connected to a second bitline BL2.

Cell strings arranged at the same row are connected to the same string select line. For example, the cell strings CS11 and CS12 are connected to a first string select line SSL1. The cell strings CS21 and CS22 are connected to a second string select line SSL2.

In example embodiments, each of the cell strings CS11, CS12, CS21, and CS22 are stacked in a direction perpendicular to a substrate (not shown). For example, the ground select transistor GST, the memory cells MC 11 to CM8, and the string select transistor SST are stacked in a direction perpendicular to the substrate. In example embodiments, a plurality of memory cells may include a charge trap flash (CTF) memory cells.

As time elapses after a CTF memory cell is programmed, charges stored in a charge storage layer migrate to a channel layer. Thus, threshold voltages of memory cells change. This physical characteristic of the CTF memory cell is called as initial verify shift (IVS). The IVS will be explained in further detail later with reference to FIG. 5.

The first memory block BLK1 shown in FIG. 1 is exemplary. Example embodiments are not limited to the first memory block BLK1 shown in FIG. 4. For example, the number of rows of the cell strings may increase or decrease. As the number of rows of the cell strings is changed, the number of string select lines or ground select lines being connected to rows of the cell strings and the number of cell strings being connected to one bit line may also be changed.

The number of columns of the cell strings may increase or decrease. As the number of columns of the cell strings is changed, the number of bit lines being connected to columns of the cell strings and the number of cell strings being connected to one string select line may also be changed.

A height of the cell strings may increase or decrease. For example, the number of memory cells stacked at each cell string may increase or decrease. As the number of memory cells stacked at each cell string is changed, the number of word lines may also be changed. The number of the string select transistors or the ground select transistors provided to each cell string may increase. As the number of the string select transistors or the ground select transistors provided to each cell string is changed, the number of the string select lines or the ground select lines may also be changed. If the number of the string select transistors or the ground select transistors is increased, the string select transistors or the ground select transistors may be stacked in the same form as the memory cells MC1 to MC8.

A write or read operation can be performed by a unit of a row of the cell strings CS11 to CS22. The cell strings CS11 to CS22 can be selected by one row unit by the string select lines SSL1 and SSL2.

In a selected row of the cell strings CS11 to CS22, a write or read operation may be performed by a page unit. The page may be one row of memory cells connected to one word line. In a selected row of the cell strings CS11 to CS22, the plurality of word lines WL1 to WL8 may select memory cells by the page unit.

Figure 5:
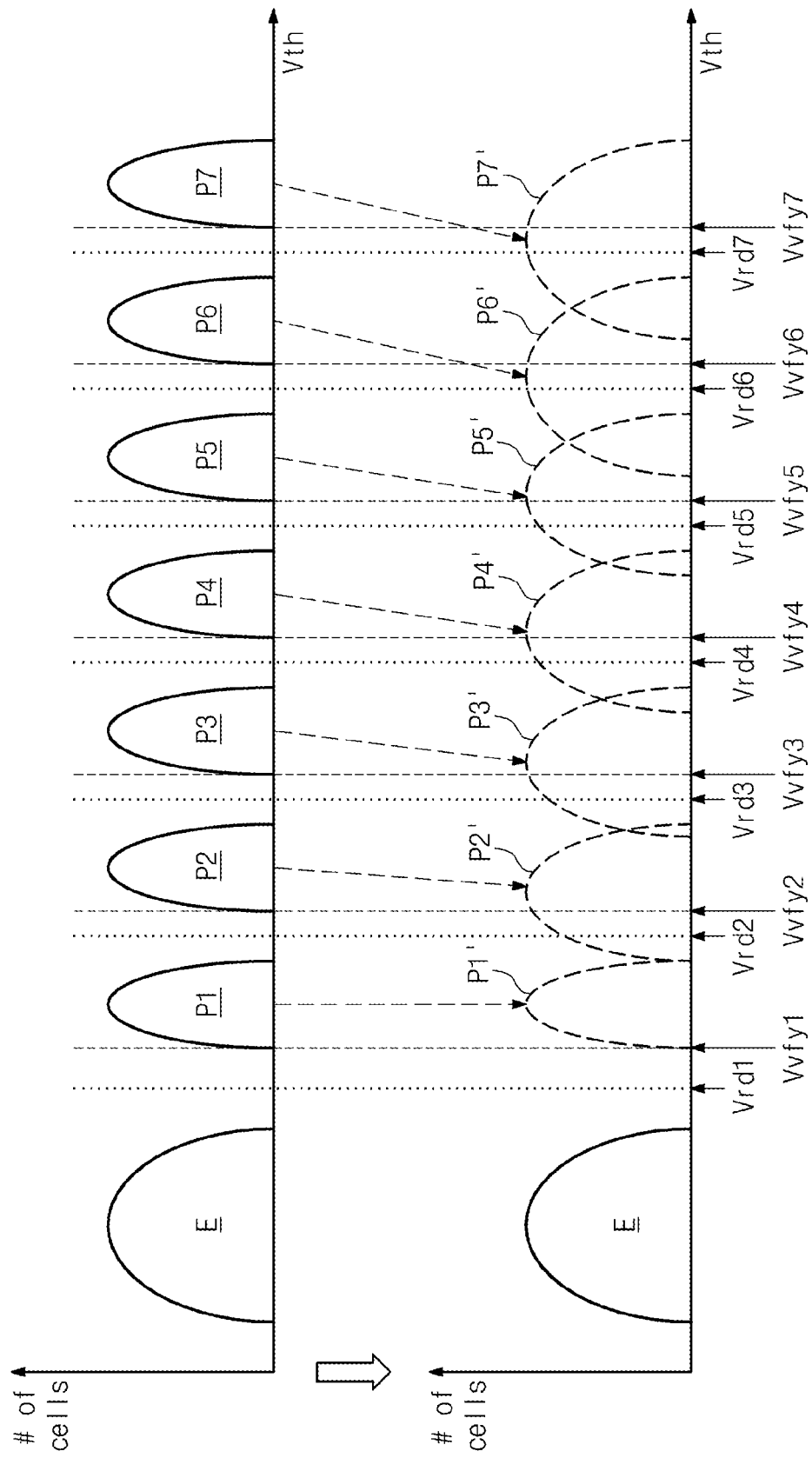
FIG. 5 is a distribution diagram of threshold voltages of the memory cells shown in FIG. 4.

FIG. 5 is a distribution diagram of threshold voltages of the memory cells shown in FIG. 4. Initial verify shift (IVS) will be described with reference to FIG. 5. Hereinafter, for brevity of description, an example will be described where each memory cell included in the nonvolatile memory device 120 is a triple-level cell (TLC) storing 3-bits. However, example embodiments are not limited to the TLC and each memory cell may be provided as a single-level cell (SLC) storing 1-bit or a multi-level cell (MLC) storing at least 2-bits. Alternatively, an operation mode of each memory cell may be changed variably to SLC or MLC.

Referring to FIGS. 4 and 5, memory cells may be programmed to have one of an erase state E and first to seventh program states P1 to P7. For example, the memory cells may be programmed to have one of the erase state E and the first to seventh program states P1 to P7, based on first to seventh verify voltages Vvfy1 to Vvfy7.

As time elapses after the memory cells are programmed, threshold voltages of the memory cells may vary. As a result, a distribution of threshold voltages corresponding to erase and program states of the memory cells may vary. For example, memory cells being programmed to have the seventh program state P7 may have a program state P7' as time elapses after they are programmed. The memory cells being programmed to have the seventh program state P7 may have a threshold voltage higher than a seventh verify voltage Vvfy7. As time elapses after the memory cells are programmed, the threshold voltages of at least some of the memory cells being programmed to have the seventh program state P7 may be lower than the seventh verify voltage Vvfy7.

Thus, the memory cells programmed to have the seventh program state P7 may have a program state P7' as time elapses after the memory cells are programmed.

Similarly, memory cells having the first to sixth program states P1 to P6 may have program states P1' to P6' as time elapses after they are programmed, respectively. That is, since charges stored in a charge storage layer of memory cells move to a channel layer as time elapses, threshold voltages of the memory cells may decrease. This physical characteristic of the memory cells is called as initial verify shift (IVS). Hereinafter, for brevity of description, the threshold voltage variation of memory cells caused by IVS will be referred to as 'charge loss'. That is, the charge loss indicates the threshold voltage variation or the amount of charges migrating to a channel layer from a charge storage layer of memory cells.

When memory cells in which threshold voltages is changed by the IVS are read, an error is included in read data. For example, the nonvolatile memory device 120 may determine a program state of memory cells based on first to seventh selected read voltages Vrd1 to Vrd7. The first to seventh selected read voltages Vrd1 to Vrd7 may have a voltage level to determine a program state of the first to seven program states P1 to P7 (e.g., initial program states). After desired and/or alternatively predetermined time, the memory cells may have program states P1' to P7' due to the IVS. In this case, if a read operation is performed based on the first to seventh selected read voltages Vrd1 to Vrd7, the read data may include an error. In example embodiments, the error may be an uncorrectable error correction code (UECC) error.

In example embodiments, the nonvolatile memory device 120 may adjust the level of a plurality of read voltages according to program elapsed time to reduce (and/or prevent) an error caused by IVS. However, since charge loss caused by the IVS may be variable depending on external factors such as temperature and an erase count of a memory block, it is difficult to select an optimal read voltage.

According to example embodiments of inventive concepts, the memory controller 110 may periodically perform IVS evaluation and store a result of the IVS evaluation during driving. Since the memory controller 110 may check IVS characteristics of the nonvolatile memory device 120 based on the stored result of the IVS evaluation, a nonvolatile memory system with improved reliability is provided.

Figure 6:
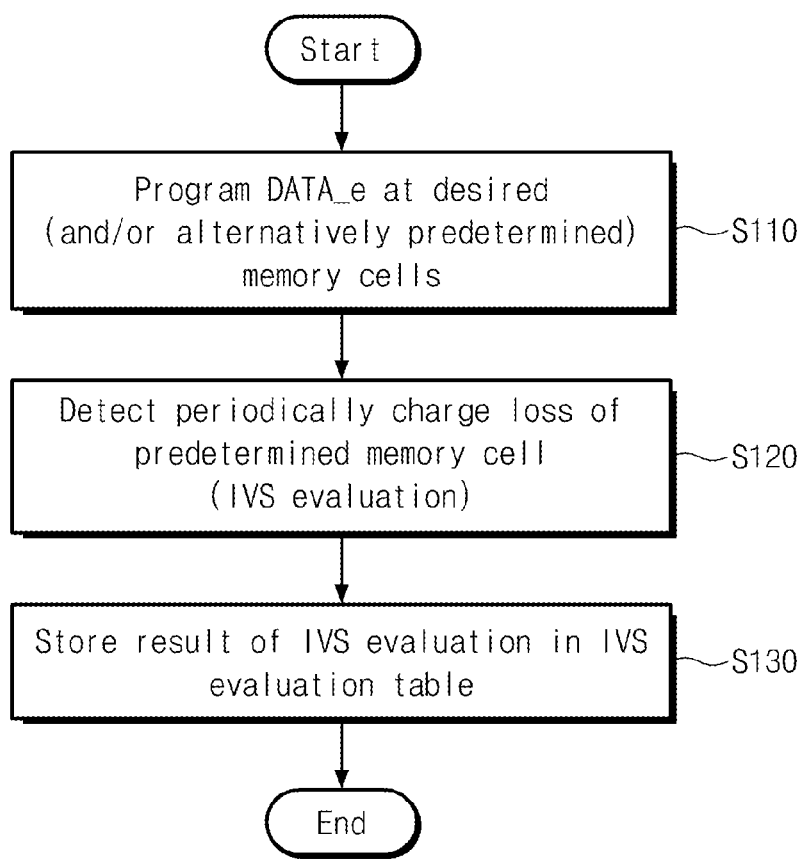
FIG. 6 is a flowchart summarizing the operation of the memory controller 110 shown in FIG. 1.

FIG. 6 is a flowchart summarizing the operation of the memory controller 110 shown in FIG. 1. Referring to FIGS. 1 and 6, in operation S110, the memory controller 110 may program evaluation data DATA_e into desired and/or alternatively predetermined memory cells. For example, the memory controller 110 may program evaluation data DATA_e for IVS evaluation into desired and/or alternatively predetermined memory cells among a plurality of memory cells included in the nonvolatile memory device 120. In example embodiments, the desired and/or alternatively predetermined memory cells may be memory cells included in a single memory block. The desired and/or alternatively predetermined memory cells may be memory cells sharing a single wordline. The desired and/or alternatively predetermined memory cells may be memory cells constituting a single page.

In operation S120, the memory controller 110 may periodically detect charge loss of the desired and/or alternatively predetermined memory cells. For example, the memory controller 110 may perform a read operation two or more times on the desired and/or alternatively predetermined memory cells. The memory controller 110 may detect the charge loss of the desired and/or alternatively predetermined memory cells based on the read operation performed two or more times. In example embodiments, a charge loss detection method may include various manners such as on-cell/off-cell counting, valley value search, peak value search, and lower value of threshold voltage search, etc. Hereinafter, the operation S120 will be referred to as IVS evaluation.

In operation S130, the memory controller 110 may store the result of the WS evaluation in the IVS evaluation table 112. For example, the memory controller 100 may perform IVS evaluation at intervals of m seconds. The memory controller 110 may store a physical address PA of desired and/or alternatively predetermined memory cells into which evaluation data DATA_e is written, charge loss CL of the desired and/or alternatively predetermined memory cells, and IVS evaluation time point in the IVS evaluation table 112 as a result of the IVS evaluation. In example embodiments, the IVS evaluation time point may be decided based on absolute time generated by a timer (not shown) incorporated in the memory controller 110.

FIG. 7 illustrates an operating method of the memory controller 110 shown in FIG. 6. Referring to FIGS. 1, 6, and 7, at zeroth time point t0, the memory controller 110 may program evaluation data DATA_e into desired and/or alternatively predetermined memory cells. In this case, the memory controller 110 may store a physical address PA1 and program time (e.g., time point t0 when the evaluation data DATA_e is programmed) of the desired and/or alternatively predetermined memory cells in the IVS evaluation table 111.

At first time point t1 after desired and/or alternatively predetermined time elapses, the memory controller 110 may perform IVS evaluation on the desired and/or alternatively predetermined memory cells (e.g., memory cells into which the evaluation data DATA_e is written). For example, threshold voltages of the desired and/or alternatively predetermined memory cells at the first time point t1 may decrease by ΔV1 as compared to the threshold voltages of the desired and/or alternatively predetermined memory cells at the zeroth time point t0. The memory controller 110 may perform IVS evaluation on the desired and/or alternatively predetermined memory cells at the first time point t1 to detect charge loss of the ΔV1. The memory controller 110 may store a physical address PA1 of the desired and/or alternatively predetermined memory cells, the IVS evaluation time point t1, and the detected charge loss ΔV1 in the IVS evaluation table 111.

Similarly, the memory controller 110 may perform IVS evaluation on desired and/or alternatively predetermined memory cells at second time point t2 and third time point t3. The memory controller 110 may store a physical address PA1 of the desired and/or alternatively predetermined memory cells, the IVS evaluation time points t2 and t3, and detected charge losses ΔV2 and ΔV3 in the IVS evaluation table 111.

In example embodiments, the zeroth time point t0 and the first time point t1, the first time point t1 and the second time point t2, and the second time point t2 and the third time point t3 may mutually have desired and/or alternatively predetermined time intervals, respectively. That is, the memory controller 110 may perform IVS evaluation at desired and/or alternatively predetermined time intervals (e.g., periodically). Although the table in FIG. 7 illustrates a result of 1st to 3rd IVS evaluations, example embodiments and more or fewer than 1st to 3rd IVS evaluations alternatively may be performed.

In example embodiments, although the IVS evaluation at the zeroth time point t0 to the IVS evaluation at the third time point t3 are shown in FIG. 7, example embodiments are not limited thereto and the memory controller 110 may periodically perform IVS evaluation. Alternatively, the memory controller 110 may periodically perform IVS evaluation desired and/or alternatively predetermined times.

According to example embodiments of inventive concepts, the memory controller 110 may periodically perform IVS evaluation on desired and/or alternatively predetermined memory cells and store a result of the IVS evaluation in the IVS evaluation table 112. Therefore, since IVS characteristics of a nonvolatile memory device may be checked, a nonvolatile memory system with improved reliability is provided.

FIGS. 8 and 9 are distribution diagrams illustrating the evaluation data DATA_e shown in FIG. 1. Referring to FIGS. 1 and 8, desired and/or alternatively predetermined memory cells may be programmed to have an erase state E and a plurality of program states P1 to P7 based on evaluation data DATA_e. For example, each of the desired and/or alternatively predetermined memory cells may be programmed to have one of the erase state E and the program states P1 to P7 based on first to seventh verify voltages Vvfy1 to Vvfy7.

The numbers of memory cells included in an erase state E and a plurality of program states P1 to P7 are equal to each other. For example, the number of memory cells having an erase state E, the number of memory cells having a first program state P1, the number of memory cells having a second program state P2, the number of memory cells having a third program state P3, the number of memory cells having a fourth program state P4, the number of memory cells having a fifth program state P5, the number of memory cells having a sixth program state P6, the number of memory cells having a seventh program state P7 may be equal to each other. That is, the evaluation data DATA_e may be decided such that the numbers of the memory cells included in each of the erase state and the first to seventh program states P1 to P7 are equal to each other. Alternatively, the evaluation data DATA_e may be randomized such that the numbers of the memory cells included in each of the erase state and the first to seventh program states P1 to P7 are equal to each other. Alternatively, the evaluation data DATA_e may be randomized such that the numbers of the memory cells included in each of the erase state and the first to seventh program states P1 to P7 are different from each other. Alternatively, the evaluation data DATA_e may be determined such that the numbers of the memory cells included in each of the erase state and the first to seventh program states P1 to P7 may be different from each other.

Referring to FIGS. 1 and 9, desired and/or alternatively predetermined memory cells may be programmed to have the seventh program state P7 based on evaluation data DATA_e'. The seventh program state P7 may be an uppermost program state among the program states P1 to P7. That is, the evaluation data DATA_e' may be set such that the desired and/or alternatively predetermined memory cells have an uppermost program state among a plurality of program sates.

In example embodiments, the evaluation data DATA_e is not limited to the above-mentioned data pattern and it will be understood that various data patterns may be applied.

Figure 10:
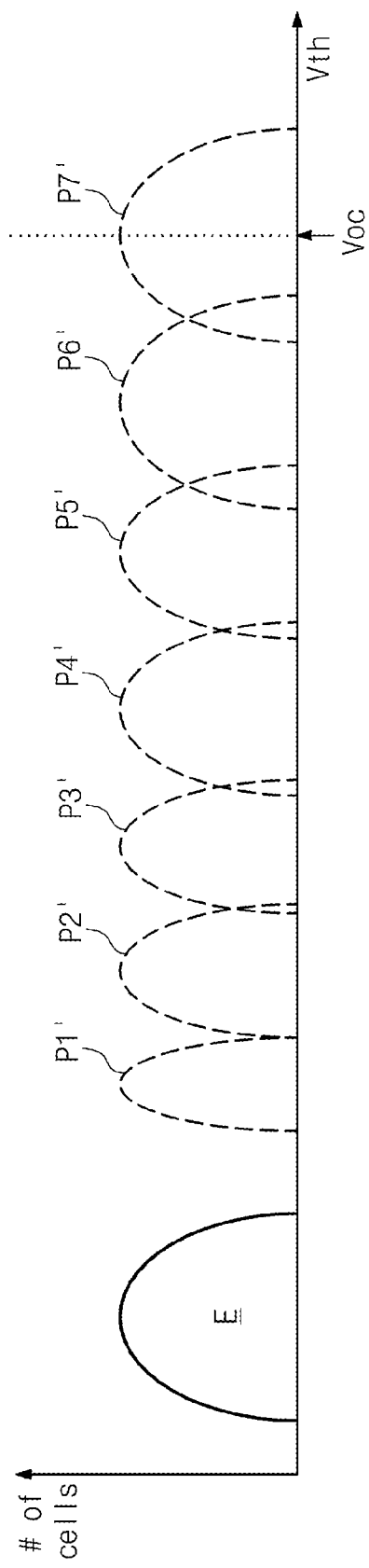
FIGS. 10 and 11 are distribution diagrams illustrating the charge loss detection method shown in FIG. 6.
Figure 11:
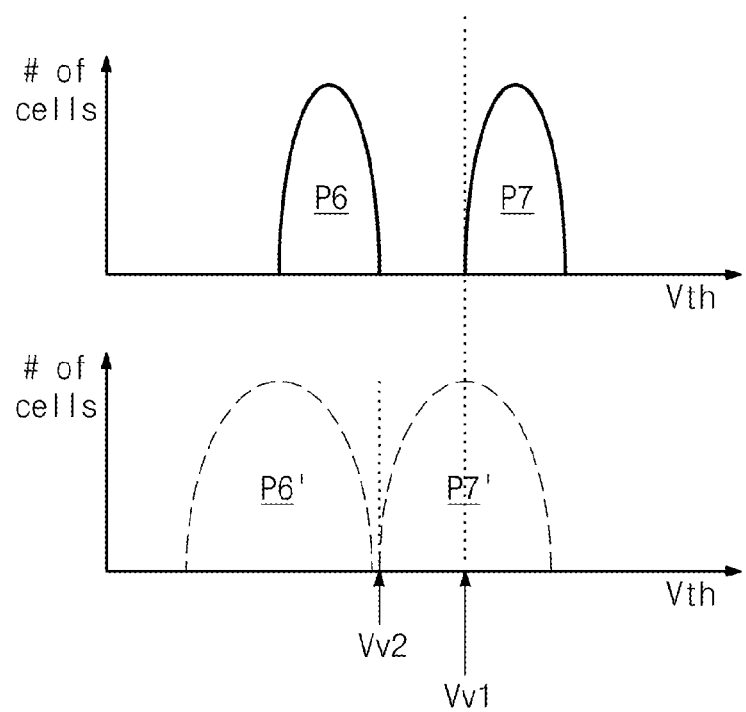

FIGS. 10 and 11 are distribution diagrams illustrating the charge loss detection method shown in FIG. 6. Referring to FIGS. 1 to 10, the memory controller 110 may detect charge loss of desired and/or alternatively predetermined memory cells based on an on-cell/off-cell counting method. For example, the memory controller 110 may read desired and/or alternatively predetermined memory cells using a reference voltage Voc. The reference voltage Voc indicates a read voltage for performing an on-cell/off-cell counting operation. The memory controller 110 may detect the number of memory cells having a threshold voltage lower than the reference voltage Voc (e.g., the number of on-cells). Alternatively, the memory controller 110 may detect the number of memory cells having a threshold voltage higher than the reference voltage Voc (e.g., the number of off-cells).

In example embodiments, the reference voltage Voc may be greater than a lower limit of a threshold voltage distribution of the seventh program state P7 (see FIG. 5) or greater than an upper limit of a threshold voltage distribution of the sixth program state P6 (see FIG. 5). However, example embodiments are not limited thereto and the reference voltage Voc may be included within the range of a threshold voltage distribution of a plurality of program states.

The memory controller 110 may detect charge loss based on the detected number of the on-cells/off-cells. For example, the charge loss may become greater as the number of the on-cells increases. Similarly, the charge loss may be become greater as the number of the off-cells decreases. The memory controller 110 may include a charge loss to on-cell lookup table (not shown) including information on relationship between charge loss and the number of on-cells/off-cells. The memory controller 110 may detect charge loss based on the detected number of the on-cells/off-cells and the charge loss to on-cell lookup table (not shown).

Referring to FIGS. 1 and 11, the memory controller 110 may detect charge loss of desired and/or alternatively predetermined memory cells based on a method for detecting a lower limit of a threshold voltage distribution. For example, the memory controller 110 may perform a plurality of read operations on the desired and/or alternatively predetermined memory cells. The memory controller 110 may detect a lower limit Vv2 of a threshold voltage distribution a program state P7' based on the plurality of read operations. The memory controller 110 may detect charge loss based on a lower limit Vv1 of a threshold voltage distribution of the seventh program state P7 (e.g., initial program state) and the detected lower limit Vv2 of the threshold voltage distribution of the program state P7'. In example embodiments, the lower limit Vv1 of the threshold voltage distribution of the seventh program state P7 (e.g., initial program state) may be identical to the seventh verity voltage Vvfy7 (see FIG. 5).

Although an on-cell/off-cell counting method and a method for detecting a lower limit of a threshold voltage distribution have been described with reference to FIGS. 10 and 11, example embodiments are not limited thereto. The memory controller 110 may detect charge loss of desired and/or alternatively predetermined memory cells based on one of various methods such as valley value search and peak value search.

Figure 12:
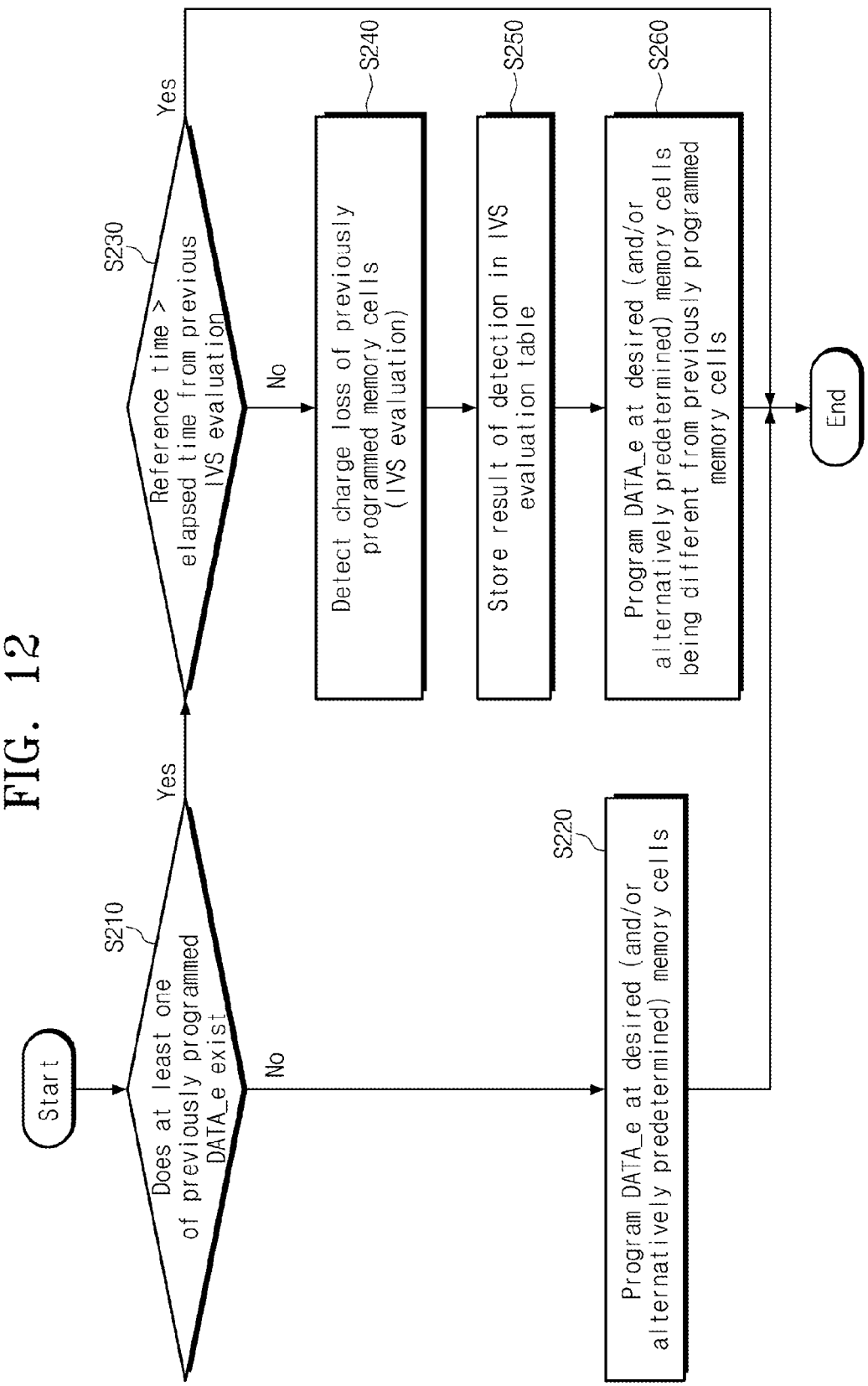
FIG. 12 is a flowchart illustrating the operation of a memory controller according to example embodiments of inventive concepts.

FIG. 12 is a flowchart illustrating the operation of a memory controller according to example embodiments of inventive concepts. Referring to FIGS. 1 and 12, in operation S210, the memory controller 110 may determine whether previously programmed evaluation data DATA_e exists. For example, the memory controller 110 may determine whether previously programmed evaluation data DATA_e exists with reference to the IVS evaluation table 112.

When previously programmed evaluation data DATA_e does not exist, in operation S220 the memory controller 110 programs evaluation data DATA_e into desired and/or alternatively predetermined memory cells. In example embodiments, the memory controller 110 may store a programmed time point of the evaluation data DATA_e and a physical address of the desired and/or alternatively predetermined memory cells in the IVS evaluation table 112.

When the previously evaluation data DATA_e exists, in operation S230, the memory controller 110 may determine whether time elapsed from previous IVS evaluation is shorter than reference time.

When the time elapsed from the previous IVS evaluation is longer than or equal to the reference time (e.g., desired and/or alternatively predetermined time elapses from the previous IVS evaluation), in operation S240, the memory controller may detect charge loss of previously programmed memory cells (e.g., memory cells into which the evaluation data DATA_e is programmed). That is, the memory controller 110 may perform IVS evaluation on the previously programmed memory cells. In operation S250, the memory controller 110 may store a result of the IVS evaluation in the IVS evaluation table 112.

In operation S260, the memory controller 110 may program evaluation data DATA_e into desired and/or alternatively predetermined memory cells being different from the previously programmed memory cells. In example embodiments, the memory controller 110 may store a physical address of desired and/or alternatively predetermined memory cells being different from the previously programmed memory cells and a programmed time point of the evaluation data DATA_e in the IVS evaluation table 112.

When the time elapsed from the previous IVS evaluation is shorter than the reference time, the memory controller 110 may not perform IVS evaluation.

According to example embodiments of inventive concepts, the memory controller 110 may write evaluation data DATA_e and perform IVS evaluation at desired and/or alternatively predetermined time intervals (e.g., periodically). That is, since the memory controller 110 may perform IVS evaluation on a plurality of evaluation data, a reliability of a result of the IVS evaluation may be improved. Thus, a nonvolatile memory system with improved reliability is provided.

Figure 13:
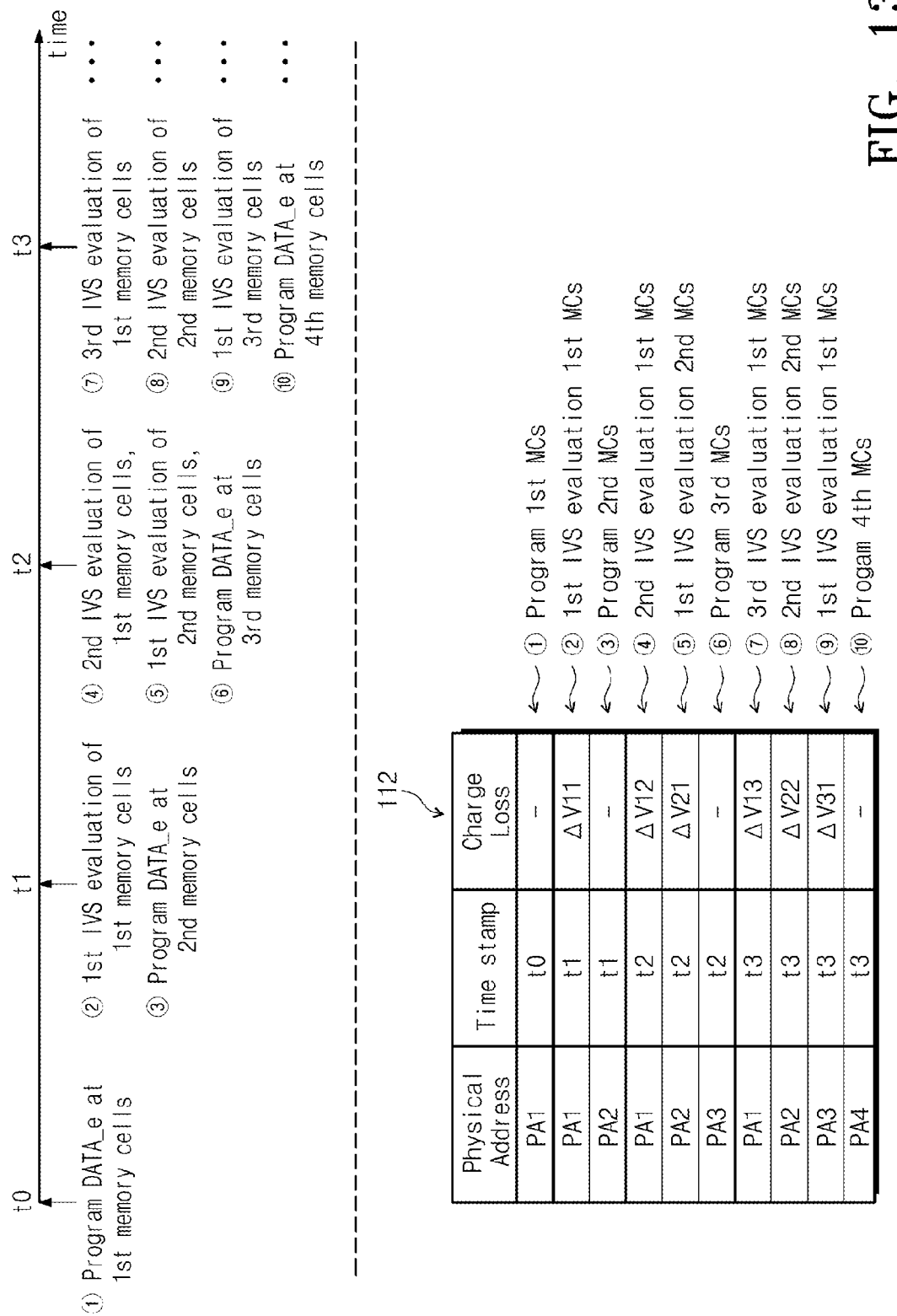
FIGS. 13 and 14 illustrate the operation of the memory controller 110 shown in FIG. 12.
Figure 14:
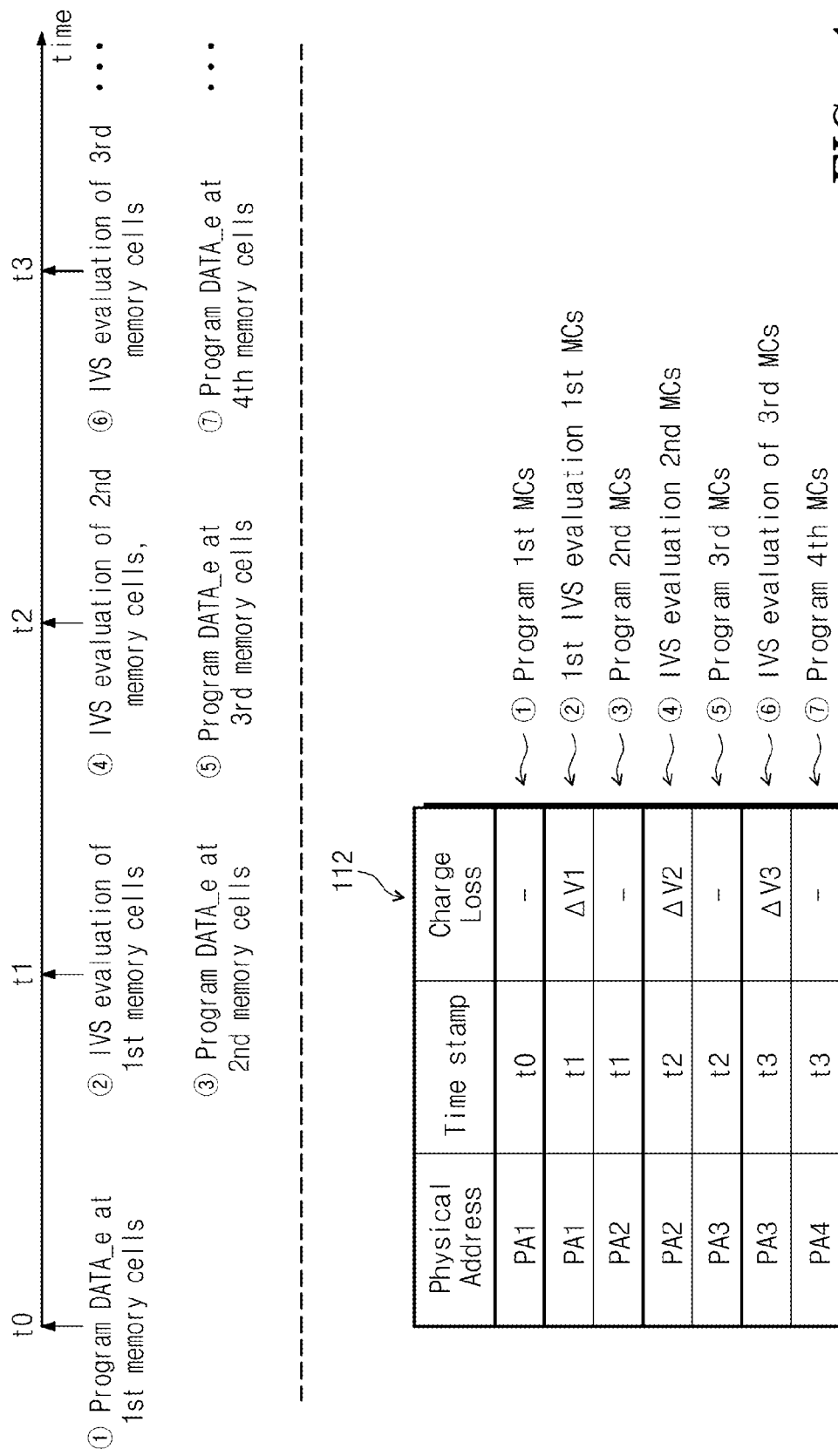

FIGS. 13 and 14 illustrate the operation of the memory controller 110 shown in FIG. 12. For brevity of description, an example will be described where first memory cells, second memory cells, third memory cells, and fourth memory cells are desired and/or alternatively predetermined memory cells having different physical positions and have first to fourth physical addresses PA1 to PA4, respectively. In addition, an example will be described where the first memory cells, the second memory cells, the third memory cells, and the fourth memory cells are memory cells constituting a page unit, respectively. However, example embodiments are not limited thereto.

Referring to FIGS. 1, 12, and 13, at zeroth time point t0, the memory controller 110 may determine whether previously programmed data DATA_e exists. Since there is no previously programmed evaluation data DATA_e at the zeroth time point t0, the memory controller 110 may program the evaluation data DATA_e into the first memory cells and may not perform separate IVS evaluation (①). In example embodiments, the memory controller 110 may store a physical address PA1 of the first memory cells and the zeroth time point t0, when the evaluation data DATA_e is written, in the IVS evaluation table 112.

At first time point t1, the memory controller 110 may determine whether previously programmed evaluation data DATA_e exists. The memory controller 110 may confirm that the evaluation data DATA_e is written into the first memory cell at the first time point t1, with reference to the IVS evaluation table 112. At the first time point t1, the memory controller 110 may perform first IVS evaluation on the first memory cells. The memory controller 110 may store a physical address PA1 of the first memory cells, the first time point t1, and detected charge loss ΔV11 in the IVS evaluation table 112 as a result of the first IVS evaluation on the first memory cells (②).

The memory controller 110 may program the evaluation data DATA_e into the second memory cells. The memory controller 110 may store a physical address PA2 of the second memory cells and the first time point t1 in the IVS evaluation table 112 (③).

Similarly, at second time point t2, the memory controller 110 may perform second IVS evaluation on the first memory cells (④), first IVS evaluation on the second memory cells (⑤), and program evaluation data Data_e into the third memory cells (⑥). The memory controller 110 may store results of the operations (④, ⑤, and ⑥) in the WS evaluation table 112. For example, the memory controller may store in the IVS evaluation table 112 detected charge loss ΔV12 of the first memory cells, the second time point t2, detected charge loss ΔV21 of the second memory cells, and a physical address PA3 of the third memory cells as a result of the operations (④, ⑤, and ⑥).

Similarly, at third time point t3, the memory controller 110 may perform third IVS evaluation (⑦) on the first memory cells, second IVS evaluation on the second memory cells (⑧), first IVS evaluation on the third memory cells (⑨), and program evaluation data Data_e in the fourth memory cell (⑩). The memory cells 110 may store results of the operations (⑦, ⑧, ⑨, and ⑩) in the IVS evaluation table 112. For example, the memory controller may store in the IVS evaluation table 112 detected charge loss ΔV13 of the first memory cells, the second time point t3, detected charge loss ΔV22 of the second memory cells, detected charge loss ΔV31 of the third memory cells, and a physical address PA4 of the fourth memory cells as a result of the operations (⑦, ⑧, ⑨, and ⑩).

In example embodiments, the memory controller 110 may repeatedly perform the foregoing operation. In example embodiments, the memory controller 110 may perform IVS evaluation on single evaluation data or a group of desired and/or alternatively predetermined memory cells up to desired and/or alternatively predetermined times.

Although not shown in the figures, the memory controller 110 may delete results of operations after desired and/or alternatively predetermined time elapses from a program operation of the evaluation data DATA_e or IVS evaluation from the IVS evaluation table 111. For example, when desired and/or alternatively predetermined time elapses from a time point when a program operation of the evaluation data DATA_e is performed on the first memory cells (e.g., the zeroth time point t0), the memory controller 110 may delete the physical address PA1 of the first memory cells and information on the zeroth time point t0 from the IVS evaluation table 112.

Alternatively, when the memory controller 110 performs the IVS evaluation on single evaluation data or a group of desired and/or alternatively predetermined memory cells up to desired and/or alternatively predetermined times, information of the memory cells on which the IVS evaluation is performed desired and/or alternatively predetermined times may be deleted from the IVS evaluation table 111. For example, when the IVS evaluation is performed on the first memory cells desired and/or alternatively predetermined times, the memory controller 110 may delete the physical address PA1 of the first memory cells and results of the IVS evaluation from the IVS evaluation table 112.

The construction and operations of the evaluation data program time point of the memory controller 110, the IVS evaluation time point, the IVS evaluation table 111, and deletion of the IVS evaluation result from the IVS evaluation table 111 are merely exemplary and may be embodied in various and alternative forms.

Referring to FIGS. 1, 12, and 14, as compared to the operating method described with reference to FIG. 13, the memory controller 110 shown in FIG. 14 performs IVS evaluation only on memory cells into which evaluation data DATA_e is programmed right before each of the first, second, and third time points t1, t2, and t3. For example, according to the operation described with reference to FIG. 13, the memory controller 110 performs second IVS evaluation on the first memory cells, first IVS evaluation on the second memory cells, and an evaluation data program operation on the third memory cells at the second time point t2. However, according to the operating method described with reference to FIG. 14, the memory controller 110 performs IVS evaluation only on the second memory cells programmed right previously (e.g., programmed at the first time point t1) at the second time point t2. Thus, since the number of IVS evaluation times decreases, an overhead caused by the IVS evaluation may be reduced.

In example embodiments, the nonvolatile memory device 120 may be performing a read, write or erase operation at a time point when IVS evaluation or an evaluation data program operation is performed (e.g., time point when desired and/or alternative predetermined time elapses from previous IVS evaluation). The memory controller 110 may perform IVS evaluation after completing the operation that the nonvolatile memory device 120 is being performing. In this case, time between a time point when IVS evaluation is performed and a time point when previous IVS evaluation is performed may be longer than reference time. That is, there may occur an error between the reference time and the time between the time point when the IVS is performed and the time point when the previously IVS is performed. The error may be reflected as an error of a result of the IVS evaluation. However, the error is time required to complete the operation that the nonvolatile memory device 120 is being performing and may be much shorter than the reference time. That is, reliability deterioration of the IVS evaluation table 113 caused by the error may be insignificant.

In example embodiments, when the nonvolatile memory device 120 performs a write, read or erase operation at a time point when IVS evaluation or an evaluation data program operation is performed (e.g., time point when desired and/or alternative predetermined time elapses from previous IVS evaluation), the memory controller 110 may perform the IVS evaluation after suspending the operation that the nonvolatile memory device 120 is being performing. In this case, the above-mentioned error may not occur.

In example embodiments, as described with reference to FIG. 14, when desired and/or alternatively predetermined time elapses from a time point when evaluation data DATA_e is programmed or IVS evaluation is performed, desired and/or alternatively predetermined-time-elapsed information (e.g., a physical address of memory cells, time information, charge loss, etc.) may be deleted.

Figure 15:
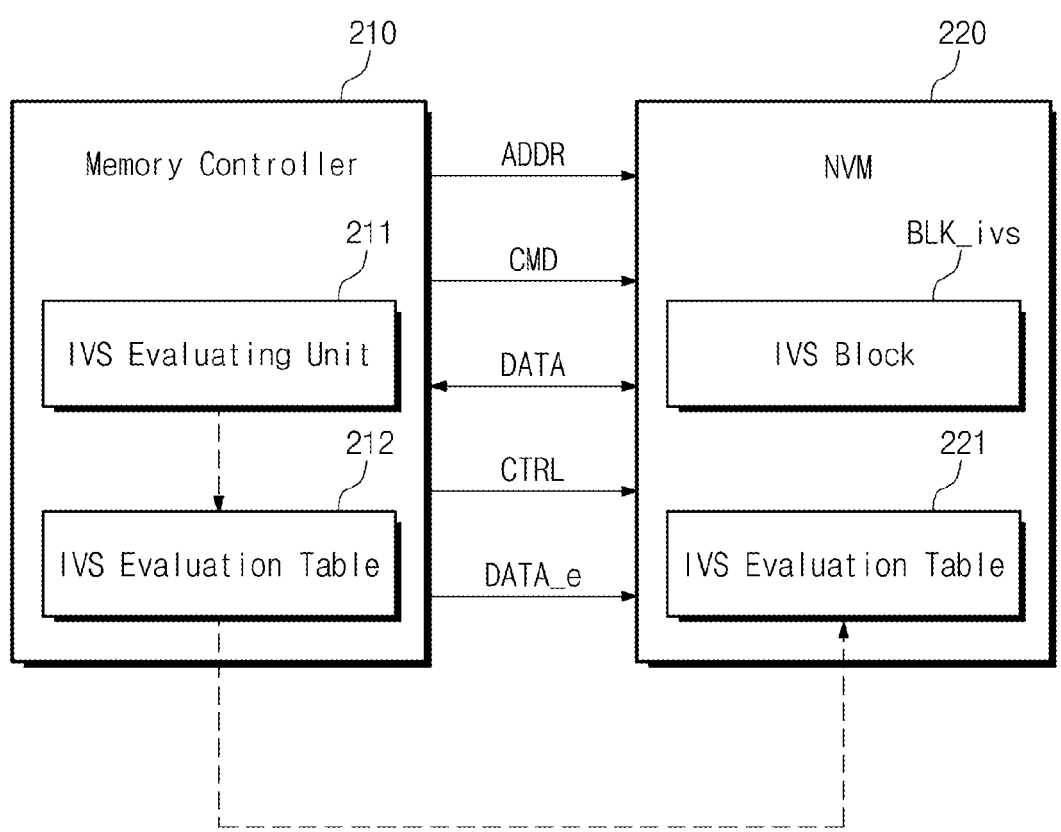
FIG. 15 is a block diagram of a nonvolatile memory system 200 according to example embodiments of inventive concepts.

FIG. 15 is a block diagram of a nonvolatile memory system 200 according to example embodiments of inventive concepts. Referring to FIG. 15, the nonvolatile memory device 200 includes a memory controller 210 and the nonvolatile memory device 220. The memory controller 210 includes an IVS evaluating unit 211 and an IVS evaluation table 212. The nonvolatile memory device 220 includes an IVS evaluation table 221 and an IVS block BLK_ivs. The memory controller 210, the IVS evaluating unit 211, the IVS evaluation tables 212 and 221, and the nonvolatile memory device 220 have been described with reference to FIGS. 1 to 14 and will not be described in further detail.

The nonvolatile memory device 220 in FIG. 15 further includes the IVS block BLK_ivs, as compared to the nonvolatile memory device 120 in FIG. 1. The IVS block BLK_ivs may include some of a plurality of memory blocks BLK1 to BLKn.

The IVS block BLK_ivs may be a memory block dedicated for IVS evaluation. For example, the memory controller 210 may select desired and/or alternatively predetermined memory cells among the memory cells included in the IVS block BLK_ivs. That is, the memory controller 210 may program evaluation data DATA_e into the IVS block BLK_ivs and perform IVS evaluation on memory cells of the IVS block BLK_ivs.

Figure 16:
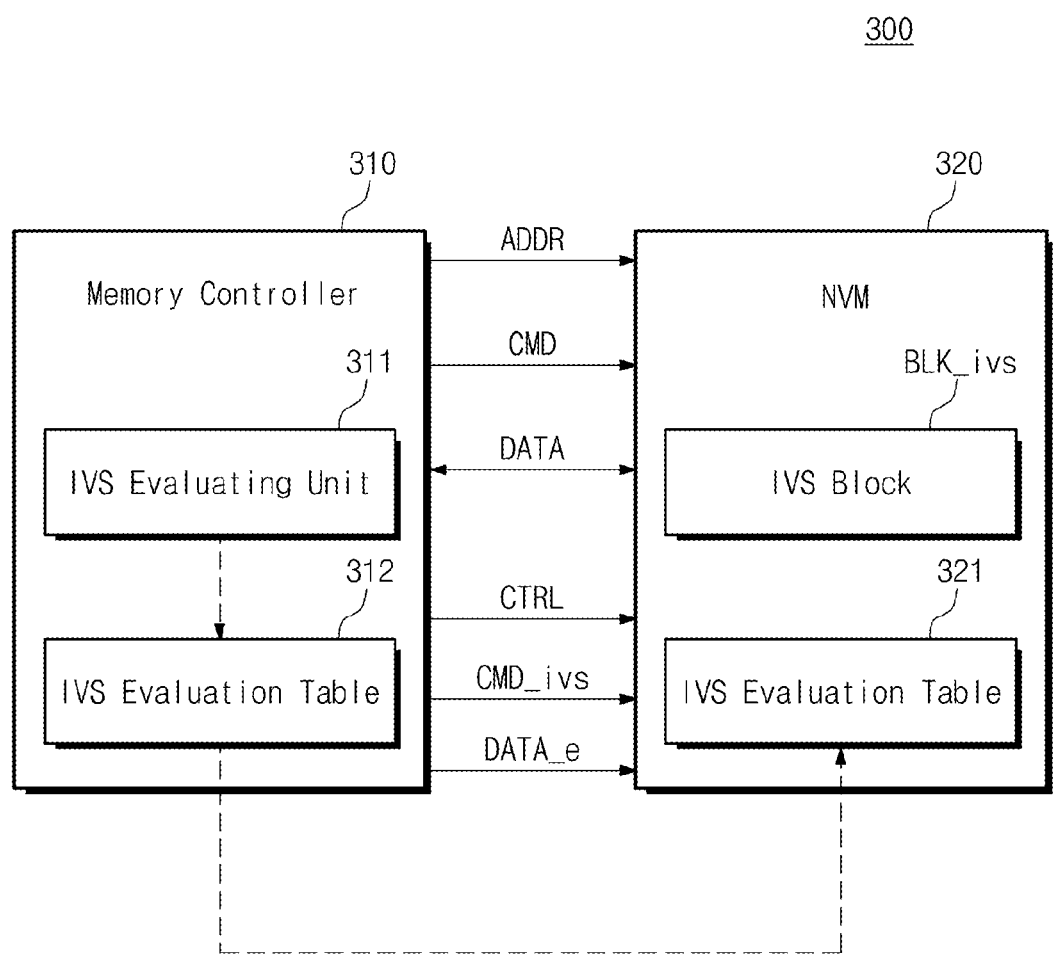
FIG. 16 is a block diagram of a nonvolatile memory system 300 according to example embodiments of inventive concepts.

FIG. 16 is a block diagram of a nonvolatile memory system 300 according to example embodiments of inventive concepts. Referring to FIG. 16, the nonvolatile memory system 300 includes a memory controller 310 and a nonvolatile memory device 320. The memory controller 310 includes an IVS evaluating unit 311 and an IVS evaluation table 312. The nonvolatile memory device 320 includes an IVS evaluation table 321 and an IVS block BLK_ivs. The memory controller 310, the IVS evaluating unit 311, the IVS evaluating tables 312 and 321, the nonvolatile memory device 320, and the IVS block BLK_ivs have been described with reference to FIGS. 1 to 15 and will not be described in further detail.

The memory controller 110 in FIG. 1 or the memory controller 210 in FIG. 15 may transmit write and read commands to the nonvolatile memory device 120 or 220 to perform a program operation of evaluation data DATA_e or IVS evaluation. Unlike this, the memory controller 310 in FIG. 16 may transmit an IVS evaluation command CMD_ivs to the nonvolatile memory device 320 to perform a program operation of evaluation data DATA_e and IVS evaluation.

That is, the nonvolatile memory device 320 may provide information (e.g., program state information of desired and/ or alternatively predetermined memory cells) for allowing the memory controller 310 to perform IVS evaluation to the memory controller 310 in response to the IVS evaluation command CMD_ivs.

Figure 17:
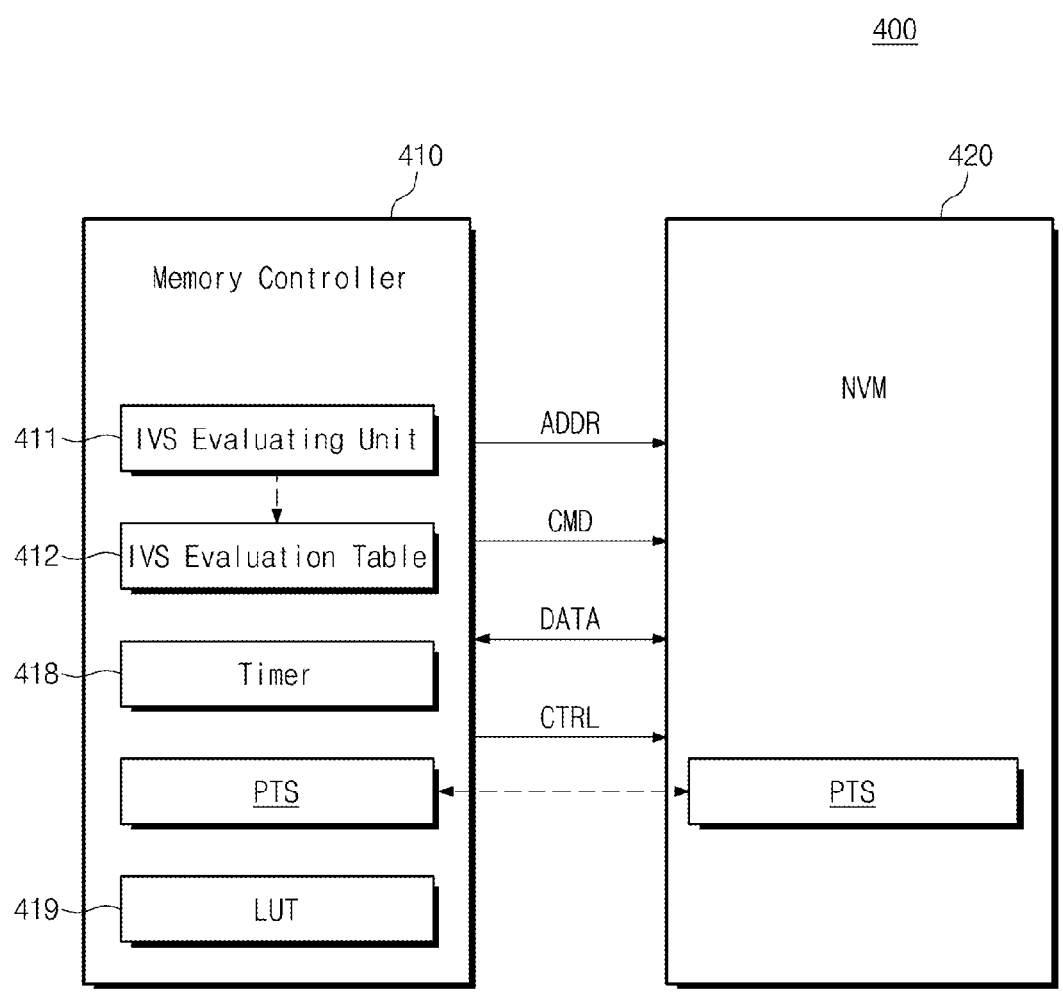
FIG. 17 is a block diagram of a nonvolatile memory system 400 according to example embodiments of inventive concepts.

FIG. 17 is a block diagram of a nonvolatile memory system 400 according to example embodiments of inventive concepts. Referring to FIG. 17, the nonvolatile memory system 400 includes a memory controller 410 and a nonvolatile memory device 420. The memory controller 410 includes an IVS evaluating unit 410, an IVS evaluation table 412, a timer 418, a program time stamp table PTS, and a lookup table LUT. The nonvolatile memory device 420 includes a program time stamp table PTS.

The memory controller 410, the IVS evaluating unit 411, the IVS evaluation table 412, and the nonvolatile memory device 420 have been described with reference to FIGS. 1 to 14 and will not be described in further detail.

The memory controller 410 may read a program time stamp table PTS stored in the nonvolatile memory device 420 and store the read program time stamp table PTS in an SRAM. Alternatively, the memory controller 410 may manage a program time stamp table PTS and may periodically or non-periodically flush the program time stamp table PTS to the nonvolatile memory device 420. In example embodiments, the nonvolatile memory device 420 may store a program time stamp table PTS in a meta area (not shown).

The program time stamp table PTS includes a position where data is stored in the nonvolatile memory device 420 (e.g., a physical address) and information on program time. For example, when user data DATA is programmed into an area corresponding to the first physical address at first time point, the memory controller 410 stores information on the first time point and the first physical address in the program time stamp table PTS.

And then, when the memory controller 420 reads the user data DATA stored in the area corresponding to the first physical address, the memory controller 420 may detect program elapsed time based on the program time stamp table PTS and the timer 418. The memory controller 420 may adjust levels of a plurality of read voltages used in the nonvolatile memory device 420 based on the detected program elapsed time and the lookup table 419.

In example embodiments, the timer 418 may externally receive a clock and count the received clock to generate current time (or absolute time). Alternatively, the timer 418 may generate a reference clock and count the generated reference clock to generate current time (or absolute time). In example embodiments, the program time stamp table PTS may be managed based on the current time generated by the timer 418.

The lookup table 419 includes information on a relationship between program elapsed time and charge loss. In example embodiments, the lookup table 419 may include a plurality of sub-lookup tables. The sub-lookup tables are differently set by temperature, erase count, and the like of a nonvolatile memory device. The lookup table 419 will be described in further detail later with reference to FIGS. 19A and 19B.

In example embodiments, when the memory 420 adjusts the levels of the read voltages used in the nonvolatile memory device 420 based on the detected program elapsed time and the lookup table 419, the memory controller 420 may select one of the sub-lookup tables based on the IVS evaluation table 412 and adjusts the levels of the read voltages based on the selected sub-lookup table. That is, since the memory controller 410 selects one of the sub-lookup tables based on the IVS evaluation table 412, characteristics of the nonvolatile memory device 420 may be reflected during an operation of adjusting the levels of the read voltages. Thus, reliability of a read operation of the nonvolatile memory system 400 may be improved.

Figure 18:
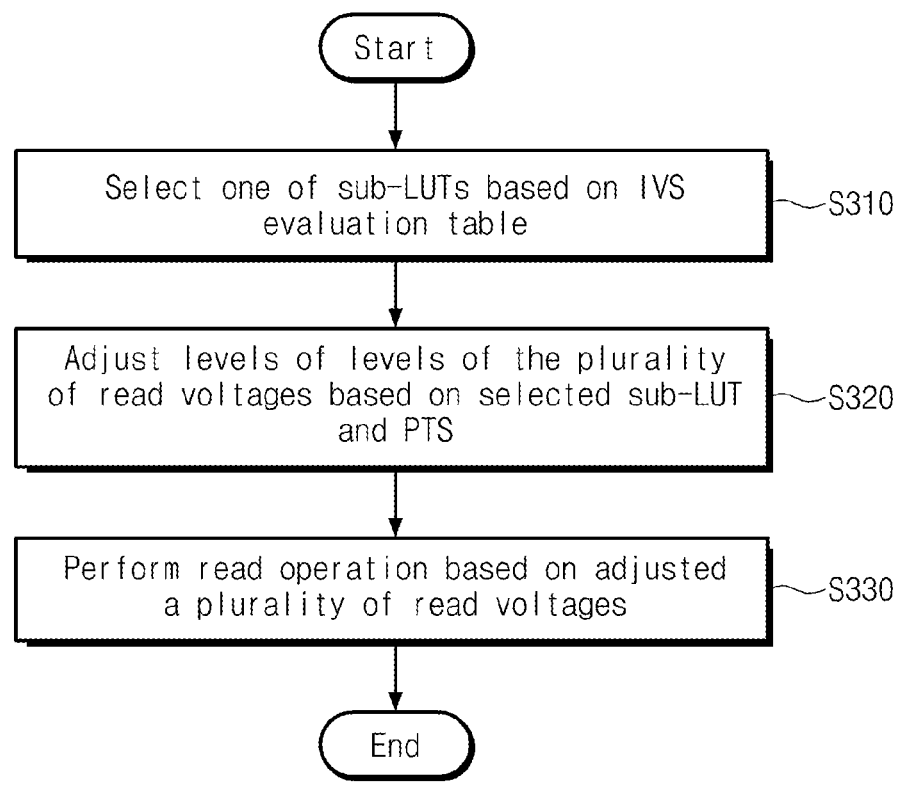
FIG. 18 is a flowchart summarizing a read operation of the memory controller in FIG. 17.
Figure 20:
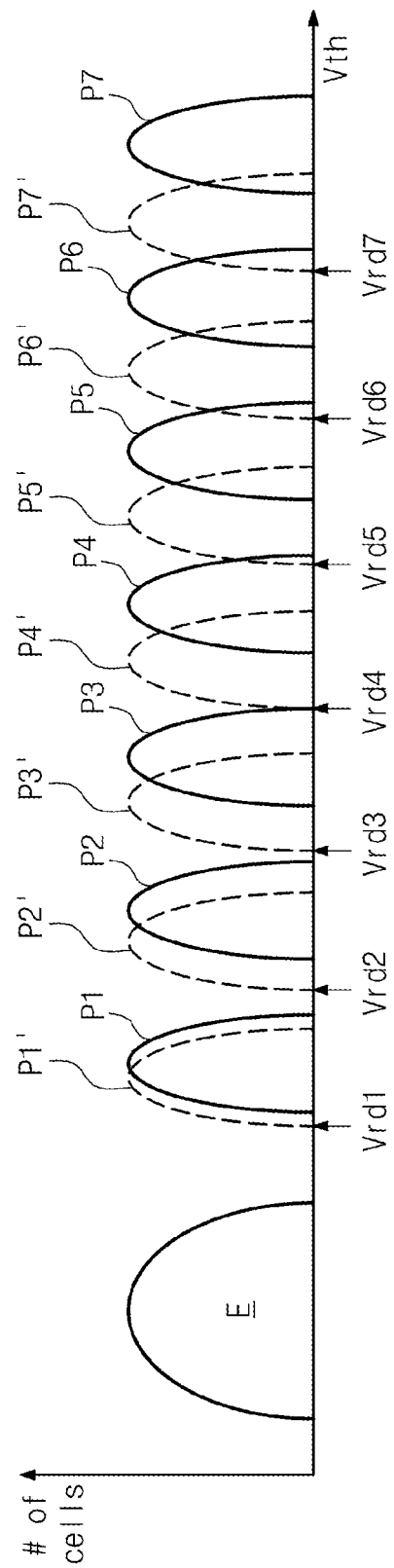
FIG. 20 is a diagram for describing operation of S320 in FIG. 18.

FIG. 18 is a flowchart summarizing a read operation of the memory controller in FIG. 17. FIG. 19A is a diagram illustrating the lookup table in FIG. 17. FIG. 19B is a diagram illustrating one of the sub-lookup tables in FIG. 19B FIG. 20 is a diagram for describing operation of S320 in FIG. 18.

In example embodiments, an example will be described where the memory controller 410 periodically performs IVS evaluation based on the operation described with reference to FIGS. 1 to 16. That is, the memory controller 410 may include an IVS evaluation table 412 and the IVS evaluation table 412 may include results of the IVS evaluation performed periodically.

Referring to FIGS. 17 to 20, the lookup table 419 may include a plurality of sub-lookup tables sLUT1 to sLUTm, as shown in FIG. 19A. Each of the sub-lookup tables sLUT1 to sLUTm includes information on relationship between charge loss and program elapsed time. The sub-lookup tables sLUT1 to sLUTm may be differently set based on various factors such as temperature and erase count of a nonvolatile memory device. For example, the first sub-lookup table sLUT1 may indicate that charge loss for first elapsed time ET1 is $\Delta V11$. However, the second sub-lookup table sLUT2 may indicate that charge loss for the first elapsed time ET1 is $\Delta V12$.

In example embodiments, each of the sub-lookup tables sLUT1 to sLUTm may include information levels of read voltages Vrd1 to Vrd7 versus elapsed time (e.g., ET1 to ETn). For example, a non-limiting example of sub-lookup table sLUT1 is illustrated in FIG. 19B. As illustrated in FIG. 19B, for elapsed time ET1, sub-look up table sLUT1 includes voltages $V_{SL1}11$ to $V_{SL1}17$ as values corresponding to the levels of read voltages Vrd1 to Vrd7. For elapsed time ET2, sub-lookup table sLUT1 includes voltages $V_{SL1}21$ to $V_{SL1}27$ as values corresponding to the levels of read voltages Vrd1 to Vrd7. For elapsed time ET3, sub-lookup table sLUT1 includes voltages $V_{SL1}31$ to $V_{SL1}37$ as values corresponding to the levels of read voltages Vrd1 to Vrd7. For elapsed time ETn, sub-lookup table sLUT1 includes voltages $V_{SL1}n1$ to $V_{SL1}n7$ as values corresponding to the levels of read voltages Vrd1 to Vrd7. The values $V_{SL1}11$ to $V_{SL1}17$ may different than the values $V_{SL1}21$ to $V_{SL1}27$, $V_{SL1}31$ to $V_{SL1}37$, and $V_{SL1}n1$ to $V_{SL1}n7$, and vice versa. In FIG. 19B, a non-limiting example where sub-lookup table sLUT1 includes values corresponding to Vrd1 to Vrd7 for each elapsed time (e.g., ET1 to ETn) is provided for a non-limiting example where the memory cells each include an erase state E and a plurality of program states (e.g., P1 to P7). However, example embodiments are not limited thereto. One of ordinary skill in the art would understand the levels of read voltages Vrd1 to Vrd7 may vary depending on a number of program states for a memory cell. Accordingly, the values corresponding to the levels of read voltages may be adjusted in the sub-lookup tables sLUT1 to sLUTn depending on the number of program states for a memory cell.

In operation S310, the memory controller 410 may select one of the sub-lookup tables based on the IVS evaluation table 412. For example, the latest IVS evaluation result among the IVS evaluation results included in the IVS evaluation table 412 may indicate that charge loss for second elapsed time ET2 is $\Delta V23$. In this case, the memory controller 410 may select the third sub-lookup table sLUT3.

In example embodiments, the memory controller 410 may select one of the sub-lookup tables based on IVS evaluation results for desired and/or alternatively predetermined time among the IVS evaluation results included in the IVS evaluation table 412. For example, among the IVS evaluation results included in the IVS evaluation table 412, IVS evaluation results for desired and/or alternatively predetermined time may indicate that charge loss of first elapsed time ET1 is $\Delta V13$, charge loss of second elapsed time ET2 is $\Delta V23$, and charge loss of third elapsed time ET3 is $\Delta V32$, respectively. In this case, since the charge losses of the first and second elapsed times ET1 and ET2 are included in the third sub-lookup table sLUT3 while the charge loss of the third elapsed time is included in the second sub-lookup table sLUT2, the memory controller 410 may select the third sub-lookup table sLUT3.

Alternatively, the memory controller 410 may select one of the sub-lookup tables based on an average of the IVS evaluations results in the IVS evaluation table 412. For example, a period of the IVS evaluation may be the first elapsed time ET1. In this case, the memory controller 410 may calculate an average of the IVS evaluation results (e.g., charge losses for the first elapsed time to a plurality of memory cells) and select one of the sub-lookup tables based on the calculated average.

In example embodiments, a sub-lookup table selecting operation of the memory controller 410 may be modified in various and alternative forms other than the above-described example. For example, the memory controller 410 may select some of the WS evaluations results, and select one of the sub-lookup tables based on the selected some of the IVS evaluations results.

In operation S320, the memory controller 410 may adjust levels of a plurality of read voltages based on the selected sub-lookup table and a program time stamp table PTS.

For example, selected memory cells of the nonvolatile memory device 420 may be programmed to have one of an erase state E and first to seventh program states P1 to P7, as shown in FIG. 20. When desired and/or alternatively predetermined time elapses after the selected memory cells are programmed, threshold voltage distributions of the selected memory cells may change to the erase state E and the program states P1' to P7'. For example, the memory controller 410 may adjust the levels of the plurality of read voltages Vrd1 to Vrd7 for program states P1' to p7', based on the information in the selected sub-lookup table for an elapsed time. For example, if the selected sub-lookup table is sLUT1 and the elapsed time is ET2, the levels of the plurality of read voltages Vrd1 to Vrd7 may be adjusted to $V_{SL1}21$ to $V_{SL1}27$ respectively. However, example embodiments are not limited thereto.

At this point, the memory controller 410 may detect program elapsed time based on the timer 418 and the program time stamp table PST and adjust the levels of the read voltages based on the detected program elapsed time and the selected sub-lookup table. That is, the memory controller 410 may detect charge loss of the selected memory cells based on the detected program elapsed time and the selected sub-lookup table. The memory controller 410 may adjust the levels of the read voltages based on the charge loss of the selected memory cells. For example, the memory controller 410 may decide levels of first to seventh read voltages Vrd1 to Vrd7, as shown in FIG. 20.

In operation S330, the memory controller 410 may perform a read operation based on the adjusted read voltage. As shown in FIG. 20, when the read operation is performed based on the read voltages adjusted by the memory controller 410, a read error caused by IVS may be reduced.

Figure 21:
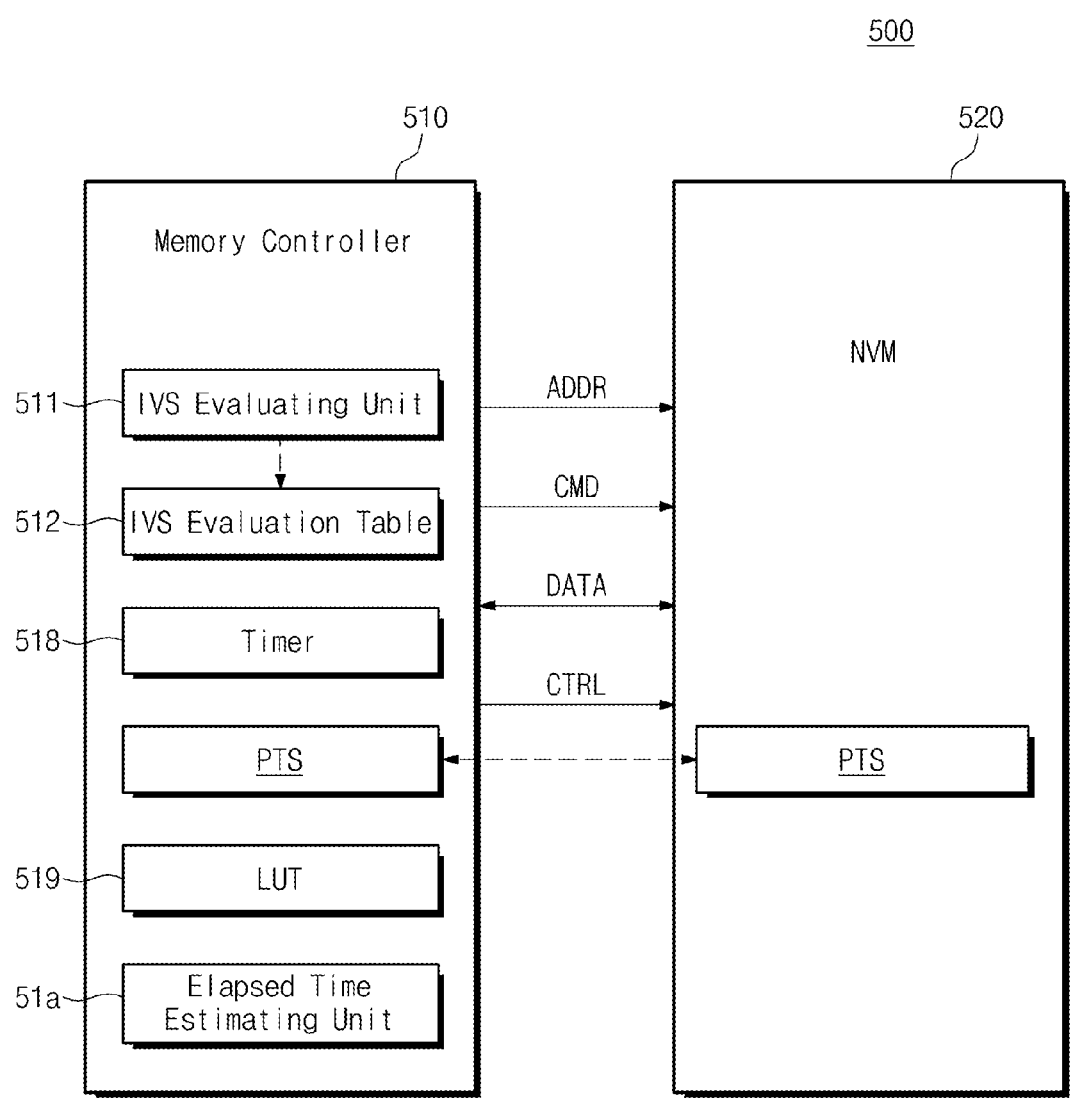
FIG. 21 is a block diagram of a nonvolatile memory system 500 according to example embodiments of inventive concepts.

FIG. 21 is a block diagram of a nonvolatile memory system 500 according to example embodiments of inventive concepts. As illustrated, the nonvolatile memory system 500 includes a memory controller 510 and a nonvolatile memory device 520. The memory controller 510 includes an IVS evaluating unit 511, an IVS evaluation table 512, a timer 518, a program time stamp table PTS, a lookup table 519, and an elapsed time estimating unit 51a. The nonvolatile memory device 520 includes a program time stamp table PTS. The memory controller 510, the IVS evaluating unit 511, the IVS evaluation table 512, the timer 518, the program time stamp table PTS, the lookup table 519, and the nonvolatile memory device 520 have been described with reference to FIGS. 1 to 17 and will not be described in further detail.

Referring to FIG. 21, the timer 518 may externally receive a clock and count the received clock to generate current time (or absolute time). Alternatively, the timer 518 may generate a reference clock and count the generated reference clock to generate current time (or absolute time). When the nonvolatile memory system 500 is powered off, the timer 518 may be reset and thus cannot generate current time. In this case, since power-off elapsed time during the power-off of the nonvolatile memory system 500 cannot be detected, it is difficult to optimally control a read voltage.

The elapsed time estimating unit 51a may detect power-off elapsed time with reference to the IVS evaluation table 512 and restore current time when the nonvolatile memory system 500 is powered on after being powered off.

Figure 22:
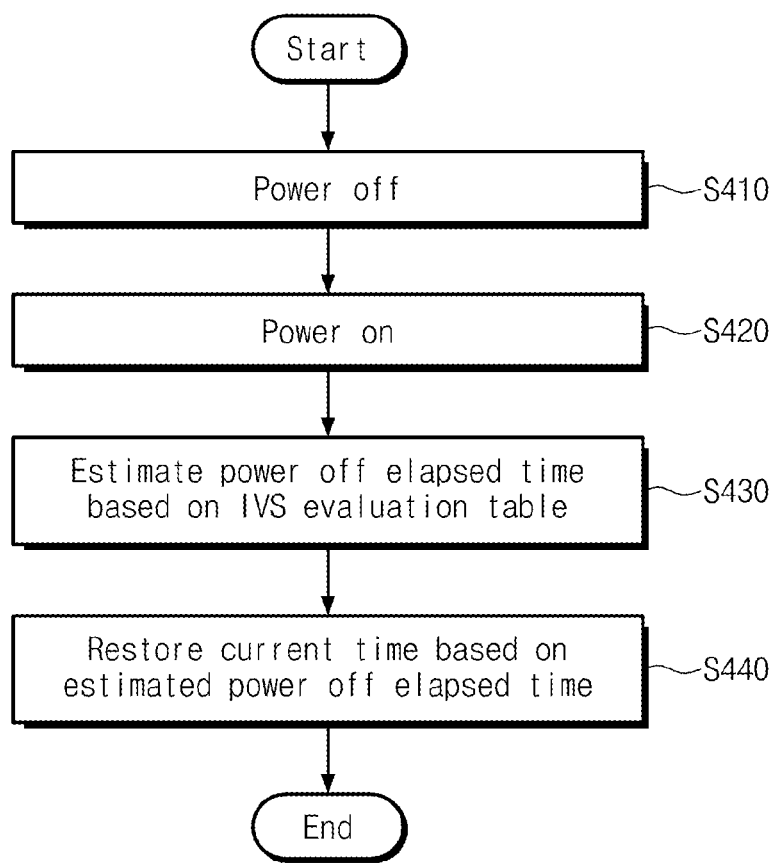
FIG. 22 is a flowchart illustrating a method for detecting power-off elapsed time of the memory controller 510 in FIG. 21.
Figure 23:
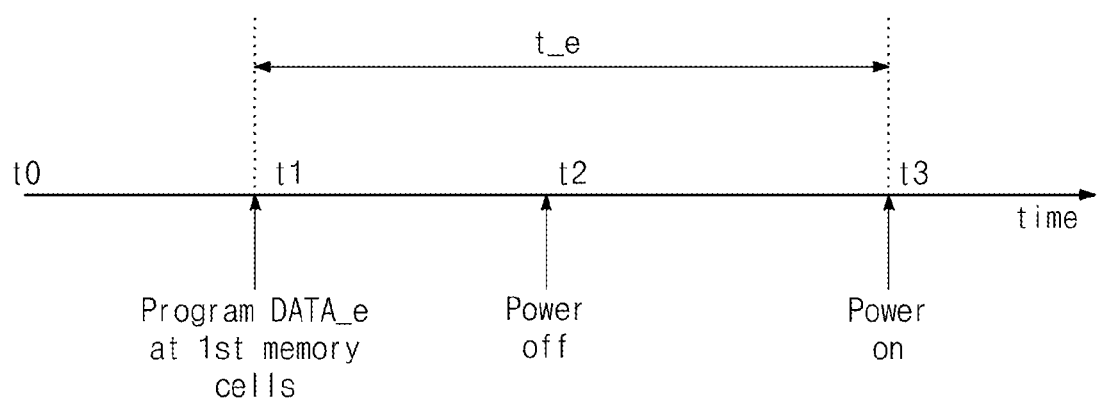
FIG. 23 is a diagram for illustrating the operation in FIG. 22.

FIG. 22 is a flowchart illustrating a method for detecting power-off elapsed time of the memory controller 510 in FIG. 21. FIG. 23 is a diagram for illustrating the operation in FIG. 22. For brevity of description, an example will be described where power-off elapsed time t_e is the time from a time point when evaluation data DATA_e is programmed latest to a time point of power-on.

Referring to FIGS. 21 to 23, in operation S410, the nonvolatile memory system 500 is powered off at second time point t2. In operation S420, after desired and/or alternatively predetermined time elapses from the power-off time point, the nonvolatile memory system 500 is powered on at third time point t3.

In operation S430, the memory controller 510 may detect the power-off elapsed time with reference to the IVS evaluation table 512. For example, the memory controller 510 may program evaluation data DATA_e into first memory cells at first time point t1 prior to the power-off (e.g., prior to the second time point t2). The first time point t1 may be a time point when IVS evaluation is performed latest or evaluation data DATA_e is programmed latest before the nonvolatile memory system 500 is powered off.

The memory controller 510 may detect charge loss of the first memory cells with reference to the IVS evaluation table 512. The memory controller 510 may detect time between the first time point t1 and the third time point t3, based on the detected charge loss and the lookup table 519 (or selected sub-lookup table). That is, the memory controller 510 may detect time from a time point when the evaluation data DATA_e is programmed latest to a time of power-on (e.g., power-off elapsed time).

The memory controller 510 may restore current time based on the detected power-off elapsed time and a time point when evaluation data is programmed latest stored in the WS evaluation table 512 (e.g., the first time point t1).

Figure 24:
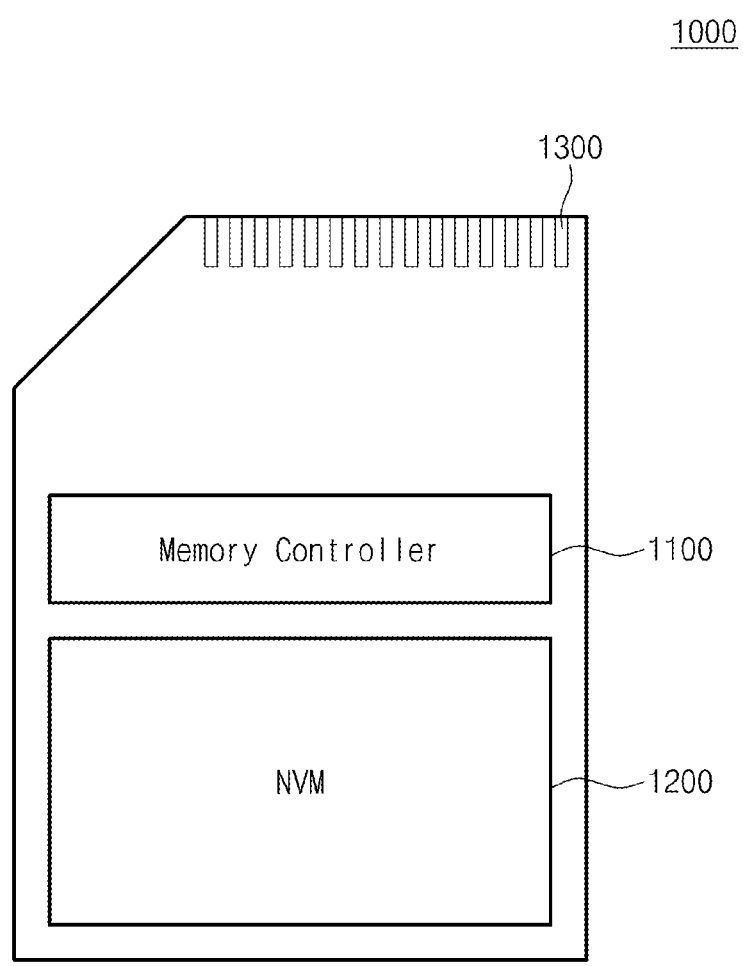
FIG. 24 is a block diagram of a memory card system to which a nonvolatile memory system according to example embodiments of inventive concepts is applied.

FIG. 24 is a block diagram of a memory card system to which a nonvolatile memory system according to example embodiments of inventive concepts is applied. As illustrated, the memory card system 1000 includes a controller 1100, a nonvolatile memory 1200, and a connector 1300.

The controller 1100 is connected to a nonvolatile memory 1200. The controller 1100 is configured to access the nonvolatile memory 1200. For example, the controller 1200 is configured to control read, write, erase, and background operations of the nonvolatile memory 1100. The controller 1200 is configured to provide interfacing between the nonvolatile memory 1100 and a host. The controller 1200 is configured to drive firmware for controlling the nonvolatile memory device 1100.

In example embodiments, the controller 1200 may include elements such as a random access memory (RAM), a processing unit, a host interface, a memory interface, and an error correction unit.

The controller 1100 may communicate with an external device via the connector 1300. The controller 1100 may communicate with an external device (e.g., host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), Firewire, and UFS (Universal Flash Storage).

In example embodiments, the controller 1100 and the nonvolatile memory 1200 may include a memory controller and nonvolatile memory devices described with reference to FIGS. 1 to 23. The nonvolatile memory 1200 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The controller 1100 and the nonvolatile memory device 1200 may be integrated into a single semiconductor device. In example embodiments, the controller 1100 and the non-volatile memory device 1200 may be integrated into a single semiconductor device to constitute a solid state drive (SSD). The controller 1100 and the non-volatile memory device 1200 may be integrated into a single semiconductor device to constitute a memory card. For example, The controller 1100 and the non-volatile memory device 1200 may be integrated into a single semiconductor device to constitute a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The nonvolatile memory device 1200 or the memory system 1000 may be mounted in various types of packages. For example, the nonvolatile memory device 1200 or the memory system 1000 may be packaged by one of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline package (TSOP), a system in package (SIP), a multi-chip package (MCP), a wafer-level fabricated package (WFP), and a wafer-level processed stack package (WSP).

Figure 25:
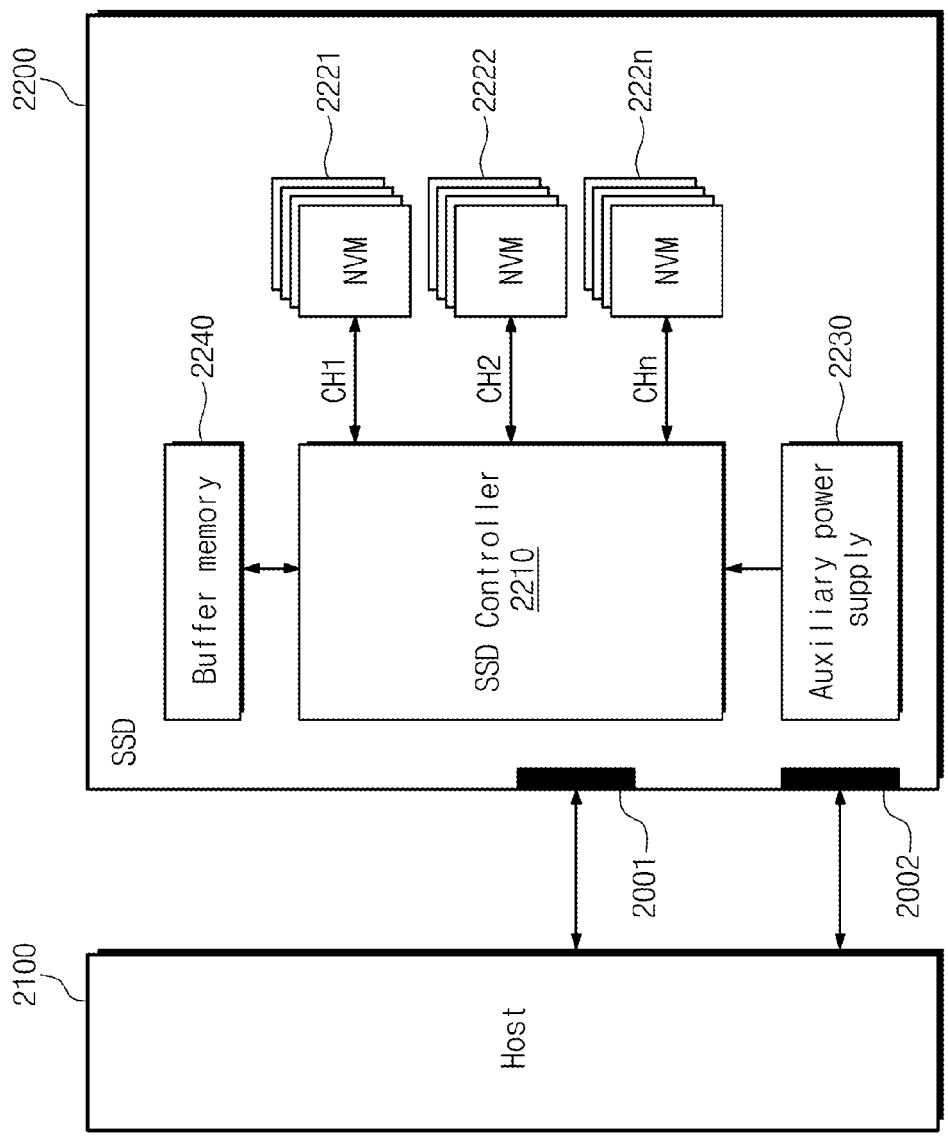
FIG. 25 is a block diagram of a solid-state drive (SSD) system to which a nonvolatile memory system according to example embodiments of inventive concepts is applied.

FIG. 25 is a block diagram of a solid-state drive (SSD) system to which a nonvolatile memory system according to example embodiments of inventive concepts is applied. As illustrated, the SSD system 2000 includes a host 2100 and an SSD 2200. The SSD 2200 transmits/receives a signal SIG to/from a host 2100 and receives power PWR via a power connector 2002. The SSD 2200 includes an SSD controller 2210, a plurality of flash memories 2221 to 222n, an auxiliary power supply 2230, and a buffer memory 2240.

The SSD controller 2210 may control the flash memories 2221 to 222n in response to the signal SIG received from the host 2100. In example embodiments, the SSD controller 2210 and the flash memories 2221 to 222n may include a memory controller and a nonvolatile memory device described with reference to FIGS. 1 to 23.

The auxiliary power supply 2230 is connected to the host 2100 via the power connector 2002. The auxiliary power supply 2230 may receive the power PWR from the host 2100 to be charged. The auxiliary power supply 2230 may supply power of the SSD system 2000 when power is not sufficiently supplied from the host 2100. In example embodiments, the auxiliary power supply 2230 may be disposed inside or outside the SSD 2200. For example, the auxiliary power supply 2230 may be disposed at a main board and may supply auxiliary power to the SSD 2200.

The buffer memory 2240 operates as a buffer memory of the SSD 2200. For example, the buffer memory 2240 may temporarily store data received from the host 2100 or data received from the flash memories 2221 to 222n or may temporarily store meta data (e.g., mapping table) of the flash memories 2221 to 222n. The buffer memory 2240 may include a nonvolatile memory such as DRAM, SDRAM, DDR SDRAM, LPDDR SDRAM, and SRAM or a nonvolatile memory such as FRAM ReRAM, STT-MRAM, and PRAM.

In example embodiments, the SSD controller 2210 may operate based on the operating method described with reference to FIGS. 1 to 23.

Figure 26:
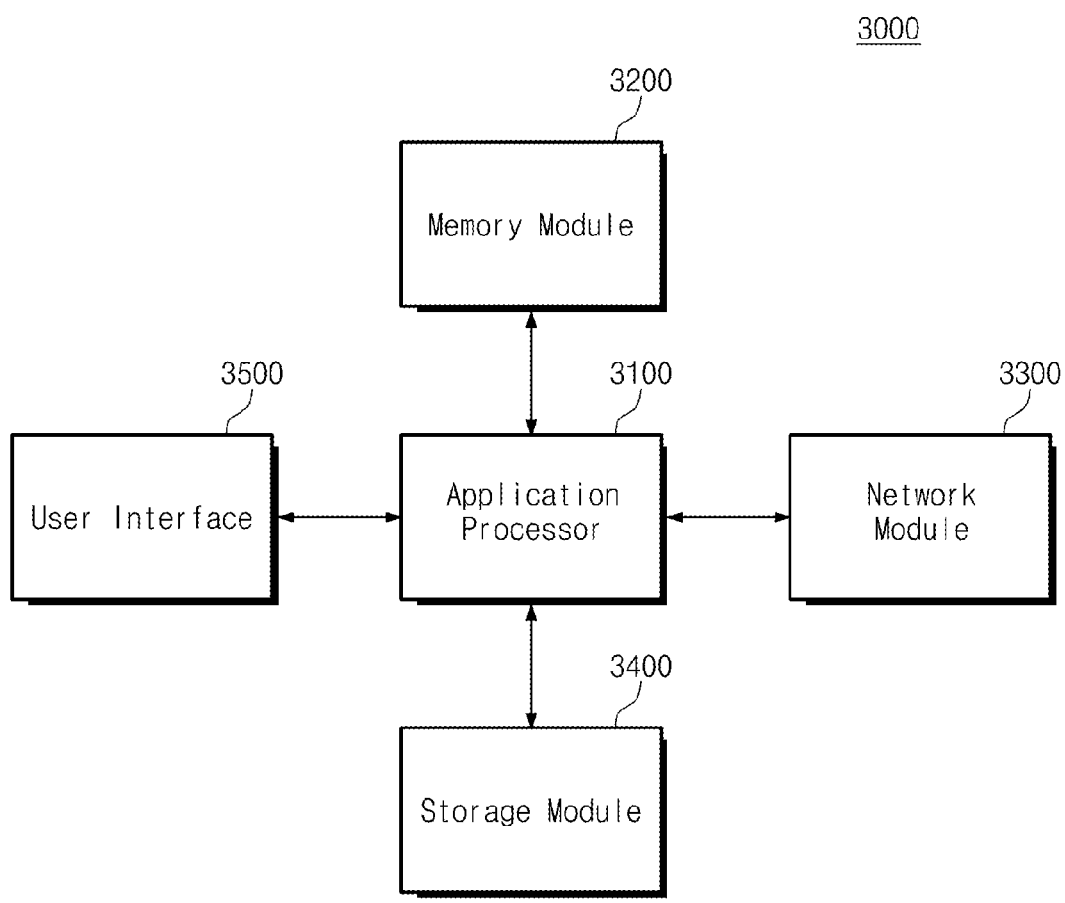
FIG. 26 is a block diagram of a user system to which a memory system according to example embodiments of inventive concepts is applied.

FIG. 26 is a block diagram of a user system to which a memory system according to example embodiments of inventive concepts is applied. As illustrated, the user system 300 includes an application processor 3100, a memory module 3200, a network module 3300, a storage module 3400, and a user interface 3500.

The application processor 3100 may drive components incorporated in the user system 3000 and operating system (OS). In example embodiments, the application processor 3100 may include controllers to control components incorporated in the user system 3000, interfaces, a graphic engine, and the like. The application processor 3100 may be provided as a system-on-chip (SoC).

The memory module 3200 may operate as a main memory, a working memory, a buffer memory or a cache memory of the user system 3000. The memory module 3200 may include a volatile random access memory such as DRAM, SDRAM, DDR SDRAM, DDR2 SDRAM, DDR3 SDRAM, LPDDR DRAM, LPDDR2 DRAM, LPDDR3, and DRAM and a non-volatile random access memory such as PRAM, ReRAM, MRAM, and FRAM. In example embodiments, the memory module 3200 and the application processor 3100 may be implemented based on package on package (POP).

The network module 3300 may communicate with external devices. In example embodiments, the network module 3300 may support wireless communication such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, and WI-DI. In example embodiments, the network module 3300 may be included in the application processor 3100.

The storage module 3400 may store data. For example, the storage module 3400 may store data received from the application processor 3100. Alternatively, the storage module 3400 may transmit its stored data to the application processor 3100. In example embodiments, the storage module 3400 may be implemented using a semiconductor memory device such as a phase-change RAM (PRAM), a magnetic RAM (MRAM), a resistive RAM (RRAM), a NAND flash memory, a NOR flash memory, a three-dimensional NAND flash memory.

In example embodiments, the storage module 3400 may be a nonvolatile memory system described with reference to FIGS. 1 to 23. The storage module 3400 may operate based on the operating method described with reference to FIGS. 1 to 23.

The user interface 3500 may interfaces to input data or a command to the application processor 3100 or output data to an external device. For example, the user interface device 3500 may include user input interfaces such as a keyboard, a keypad, a button, a touch panel, a touch screen, a touch ball, a touch pad, a camera, a gyroscope sensor, and a vibration sensor. The user interface device 3500 may include user output interfaces such as an liquid crystal display (LCD), an organic light emitting diode (OLED) display, an active matrix OLED (AMOLED) display, an LED, a speaker, and a motor.

According to example embodiments of inventive concepts, a memory controller programs evaluation data for IVS evaluation into a nonvolatile memory device and periodically performs IVS evaluation on memory cells into which the evaluation data is written. The memory controller stores a result of the IVS evaluation in an IVS evaluation table. The memory controller may adjust levels of a plurality of read voltages power-off elapsed time upon power-on/reset based on the IVS evaluation table to restore current time. Thus, a nonvolatile memory system with improved reliability is provided.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. An operating method of a memory controller configured to control a nonvolatile memory device including a plurality of memory cells, the operating method comprising:
   programming evaluation data into desired memory cells among the plurality of memory cells;
   performing charge loss evaluation on the desired memory cells after a time elapses from a time point when the evaluation data is programmed, the charge loss evaluation including an operation of detecting threshold voltage variation of the desired memory cells over a period based on the time elapsed from the time point when the evaluation data is programmed;
   storing a result of the charge loss evaluation; and
   adjusting levels of a plurality of read voltages used in the nonvolatile memory device based on the stored result of the charge loss evaluation.

2. The operating method as set forth in claim 1, wherein the charge loss evaluation is periodically performed.

3. The operating method as set forth in claim 1, wherein the storing the result of the charge loss evaluation includes:
   storing a physical address of the desired memory cells, the time elapsed from the time point when the evaluation data is programmed, and the detected threshold voltage variation.

4. The operating method as set forth in claim 1, wherein the evaluation data is set data such that the desired memory cells are programmed to have an uppermost program state among a plurality of program states of the plurality of memory cells.

5. The operating method as set forth in claim 1, wherein the storing the result of the charge loss evaluation includes:
   storing a physical address of the desired memory cells and the time point when the evaluation data is programmed.

6. The operating method as set forth in claim 1, wherein performing the charge loss evaluation on the desired memory cells comprises:
   reading the desired memory cells using a reference voltage,
   detecting a number of on-cells of the desired memory cells based on a result of the reading the desired memory cells, and
   detecting the threshold voltage variation based on the detected number of the on-cells.

7. The operating method as set forth in claim 1, wherein the performing the charge loss evaluation on the desired memory cells includes:
   detecting the threshold voltage variation based on a change amount of a lower limit of threshold voltage distribution of the desired memory cells.

8. The operating method as set forth in claim 1, wherein the adjusting the levels of the read voltages includes:
selecting one of a plurality of sub-lookup tables based on the stored result of the charge loss evaluation, and
adjusting the levels of the read voltages based on the selected sub-lookup table, and
each of the sub-lookup tables includes information on the threshold voltage variation to program elapsed time and the levels of the read voltage.

9. The operating method as set forth in claim 1, further comprising:
detecting power-off elapsed time based on the stored result of the charge loss evaluation and the desired memory cells when power is on after off; and
restoring current time based on the detected power-off elapsed time.

10. A nonvolatile memory system comprising:
a nonvolatile memory device including a plurality of memory cells; and
a memory controller configured to program evaluation data into desired memory cells among the plurality of memory cells, perform charge loss evaluation on the desired memory cells in which the evaluation data is stored after a threshold time elapses from a time point when the evaluation data is programmed, and store a result of the charge loss evaluation in an charge loss evaluation table, the charge loss evaluation including an operation of detecting threshold voltage variation of the desired memory cells over a period based on the time elapsed from the time point when the evaluation data is programmed.

11. The nonvolatile memory system as set forth in claim 10, wherein the memory controller includes a memory, and the memory controller is configured to store the charge loss evaluation table in the memory.

12. The nonvolatile memory system as set forth in claim 11, wherein the result of the charge loss evaluation includes a physical address of the desired memory cells, a time elapsed from the time point when the evaluation data is programmed, and the detected threshold voltage variation.

13. The nonvolatile memory system as set forth in claim 11, wherein the charge loss evaluation table includes a physical address of the desired memory cells and the time point when the evaluation data is programmed.

14. The nonvolatile memory system as set forth in claim 11, wherein the memory includes a plurality of sub-lookup tables, the memory controller is configured to select one of the sub-lookup tables based on the stored result of the charge loss evaluation and adjust levels of a plurality of read voltages of the nonvolatile memory device based on the selected sub-lookup table, and each of the sub-lookup tables includes information on the threshold voltage variation to program elapsed time and the levels of the read voltages.

15. The nonvolatile memory system as set forth in claim 11, wherein the nonvolatile memory device comprises at least one three dimensional memory block,
wherein the at least one three dimensional memory block includes a plurality of strings connected between a bit line and a common source line, each of the plurality of strings including a plurality of memory cells connected in a series, each of the plurality of memory cells being connected to word lines stacked in a direction perpendicular to a substrate.

16. An method of operating a memory system including a controller configured to control a nonvolatile memory device, the nonvolatile memory device including a plurality of memory cells, the operating method comprising:
performing charge loss evaluation on first memory cells among the plurality of memory cells, the first memory cells being programmed with evaluation data, after a time elapses from a time point when the first memory cells were programmed with evaluation data;
storing a result of the performing the charge loss evaluation on the first memory cells; and
controlling a read operation of the first memory cells based on the result of the performing the charge loss evaluation on the first memory cells.

17. The method of claim 16, wherein
the charge loss evaluation includes detecting threshold voltage changes of the first memory cells over a time period, and
the controlling the read operation of the first memory cells includes adjusting read voltage levels applied to the first memory cells during the read operation based on the result of the performing the charge loss evaluation on the first memory cells.

18. The method of claim 16, further comprising:
performing at least one subsequent charge loss evaluation on the first memory cells after the performing charge loss evaluation, the charge loss evaluation and the at least one subsequent charge loss evaluation including detecting threshold variation changes in the first memory cells over time periods determined based on the time point when the evaluation data is programmed in the first memory cells and when the charge loss evaluation and the at least one subsequent charge loss evaluation are performed;
storing a result of the performing at least one subsequent charge loss evaluation on the first memory cells; and
adjusting read voltage levels applied to the first memory cells during the read operation after the at least one subsequent charge loss evaluation based on the result of the performing at least one subsequent charge loss evaluation.

19. The method of claim 16, further comprising:
selecting one of a plurality of sub-lookup tables based on the stored result of the performing the charge loss evaluation on the first memory cells,
wherein each of the sub-lookup tables includes information on the threshold voltage variation to program elapsed time and the levels of the read voltage, and
the controlling the read operation of the first memory cells includes adjusting the levels of the read voltages applied to the first memory cells based on the information in the selected sub-lookup table.

20. The method of claim 16, further comprising:
programming evaluation data into second memory cells among the plurality of memory cells during the performing charge loss evaluation on the first memory cells;
performing charge loss evaluation on the first memory cells and the second memory cells after the time elapses from a time point when the evaluation data is programmed into the second memory cells;
storing a result of the performing charge loss evaluation on the first memory cells and the second memory cells;
controlling the read operation of the first memory cells and a read operation of the second memory cells based on the result of the performing charge loss evaluation on the first memory cells and the second memory cells.

* * * * *